US012733554B2

(12) United States Patent
Lee et al.

(10) Patent No.: US 12,733,554 B2

(45) Date of Patent: Sep. 8, 2026

(54) LIGHT EMITTING DISPLAY DEVICE

(71) Applicant: LG Display Co., Ltd., Seoul (KR)

(72) Inventors: Joonsuk Lee, Paju-si (KR); DoYoung Kum, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 345 days.

(21) Appl. No.: 18/469,904

(22) Filed: Sep. 19, 2023

(65) Prior Publication Data

US 2024/0186307 A1 Jun. 6, 2024

(30) Foreign Application Priority Data

Dec. 5, 2022 (KR) ........................ 10-2022-0167577

(51) Int. Cl.

| | |
|---|---|
| ***H10W 90/00*** | (2026.01) |
| ***H10D 86/40*** | (2025.01) |
| ***H10D 86/60*** | (2025.01) |
| ***H10H 20/857*** | (2025.01) |

(52) U.S. Cl.

CPC .......... *H10W 90/00* (2026.01); *H10D 86/423* (2025.01); *H10D 86/441* (2025.01); *H10D 86/481* (2025.01); *H10D 86/60* (2025.01); *H10H 20/857* (2025.01)

(58) Field of Classification Search

CPC ........... H10K 59/1213; H10K 59/1216; H10K 59/80522; H10K 50/82; H10K 59/8052; H10K 59/126; H10K 59/1315; H10K 59/1201; H10K 59/131; H10K 59/123; H10K 59/124; H10K 59/8051; H10W 90/00; H10D 30/67; H10D 30/6758; H10D 30/6757; H10D 30/6732; H10D 86/423; H10D 86/441; H10D 86/481; H10D 86/60; H10D 30/6755; H10H 20/857; H10H 29/10

See application file for complete search history.

(56) References Cited

U.S. PATENT DOCUMENTS

| | | | | |
|---|---|---|---|---|
| 9,859,520 | B2 | 1/2018 | Kim | |
| 10,263,211 | B2 | 4/2019 | Byun et al. | |
| 2016/0149155 | A1 | 5/2016 | Kim | |
| 2016/0293888 | A1* | 10/2016 | Shim .................... | H10K 59/122 |
| 2018/0033858 | A1 | 2/2018 | Moon et al. | |

(Continued)

FOREIGN PATENT DOCUMENTS

| | | |
|---|---|---|
| CN | 109326612 A | 2/2019 |
| GB | 2570789 A | 8/2019 |

(Continued)

OTHER PUBLICATIONS

Intellectual Property Office of the United Kingdom, Combined Search and Examination Report, United Kingdom Patent Application No. GB2315199.6, Mar. 25, 2024, five pages.

*Primary Examiner* — Wasiul Haider

(74) *Attorney, Agent, or Firm* — Fenwick & West LLP

(57) ABSTRACT

A light emitting display device includes a circuit layer including a thin film transistor (TFT) and an auxiliary power electrode disposed on a substrate, at least one protection layer covering the circuit layer, and a contact portion passing through the at least one protection layer to expose a portion of the auxiliary power electrode, wherein the TFT includes an active layer, and the auxiliary power electrode is disposed on the same layer as the active layer.

19 Claims, 16 Drawing Sheets

(56) References Cited

U.S. PATENT DOCUMENTS

| | | | | |
|---|---|---|---|---|
| 2018/0123078 | A1* | 5/2018 | Byun | H10D 30/6723 |
| 2020/0212121 | A1* | 7/2020 | Kang | H10K 59/35 |
| 2021/0183975 | A1 | 6/2021 | Lee et al. | |
| 2022/0102471 | A1 | 3/2022 | Jang et al. | |
| 2023/0130009 | A1* | 4/2023 | Lee | H10K 71/00<br>257/40 |

FOREIGN PATENT DOCUMENTS

| | | | |
|---|---|---|---|
| KR | 10-2016-0062646 | A | 6/2016 |
| KR | 10-2016-0099346 | A | 8/2016 |
| KR | 10-2018-0013226 | A | 2/2018 |
| KR | 10-2018-0046229 | A | 5/2018 |
| KR | 10-2021-0076515 | A | 6/2021 |
| KR | 10-2022-0042815 | A | 4/2022 |

* cited by examiner

AA
PA(NA)
BA
OC
OC_PS
PAS
GI
BUF
SUB
PAS_H
PAS_HS
UC
OC_P
PAS_P
UCA
CA
PAS_PS
OC_H
OC_HS
AXE
BA_H
CH4
AXE_CP
BA
EVSS
CH3
ED
PXE
EL
CE
C3
C2
C1
Cst
LS
PXE2
PXE2c
PXE2b
PXE2a
SD2
GA
GI
ACT
SD1
TR
PXE1
CH2
CH1
CH5
PE
PE1
PE2
PE3

BUF
SUB
EVSS
C1
LS
PR
PR1
PR2
300
301
302
303

BUF
SUB
AXE
C2
EVSS
C1
ACT
ACT_C1
ACT_CH
ACT_C1
LS

OC
PAS
GI
BUF
SUB
CA
AXE
CH4
AXE_CP
EVSS
CH3
C3
C2
C1
Cst
PXE
LS
PXE2
PXE2c PXE2b PXE2a
SD2
GA
GI
ACT
SD1
TR
PXE1
CH2
CH1
PE
PE1 PE2 PE3
CH5

OC
PAS
GI
BUF
SUB
CA
AXE
UCA
CH4
AXE_CP
BA
EVSS
CH3
C3
C2
C1
Cst
PXE
LS
PXE2
PXE2c PXE2b PXE2a
PXE1
SD2
GA
GI
ACT
SD1
TR
CH2
CH1
CH5
PE
PE1 PE2 PE3

100
PA(NA)
AA
PE
PE1 PE2 PE3
CH5
CH1
CH2
PXE1
PXE2
PXE2c PXE2b PXE2a
SD1 ACT GI GA SD2
TR
LS
ED
PXE EL CE
C1 C2 C3
Cst
CH3
EVSS
BA
AXE_CP
CH4
CA
UCA
AXE
OC
PAS
GI
BUF
SUB

LIGHT EMITTING DISPLAY DEVICE

CROSS-REFERENCE TO RELATED APPLICATIONS

This application claims the benefit of Republic of Korea Patent Application No. 10-2022-0167577 filed on Dec. 5, 2022, which is hereby incorporated by reference in its entirety.

BACKGROUND

Technical Field

The present disclosure relates to a light emitting display device.

Discussion of the Related Art

With the advancement of an information-oriented society, attention and requirements for a display device configured to display image(s) have been increased. Accordingly, a display device such as a Liquid Crystal Display (LCD), an organic light emitting display (OLED), a Micro Light Emitting Diode (Micro LED), a quantum dot display device (QD), or the like is utilized.

Among these display devices, the light emitting display device is classified as an inorganic light emitting display device or an organic light emitting display device depending on a material of a light emitting layer. For example, an organic light emitting display device is self-luminous, wherein holes and electrons are injected into an emission layer from an anode electrode for a hole injection and a cathode electrode for an electron injection, and light is emitted when excitons in which the injected holes and electrons are combined fall from an excited state to a ground state, to thereby display an image.

The light emitting display device may be divided into a top emission type, a bottom emission type, or a dual emission type according to a direction in which light is emitted.

In the case of the light emitting display device of the top emission type, a transparent electrode or a semi-transmissive electrode may be used as a cathode to emit light from the light emitting layer to an upper portion. The cathode electrode has a thin profile (or thickness) to improve transmittance, thereby increasing an electrical resistance. Particularly, in the case of the large-sized light emitting display device, a voltage drop may be more severely generated as a distance from a voltage supplying pad increases, whereby a luminance non-uniformity problem of the light emitting display device might occur.

The above content of the background technology may be retained for a deduction of the present disclosure by inventors or may be technology information learned by practice of embodiments of the present disclosure. However, the above content of the background technology may be not a prior art published to the general public before an application of the present disclosure.

SUMMARY

To solve a problem where voltage drop occurs due to an increase in resistance of a cathode electrode in a light emitting display device, a method is being proposed where voltage drop is reduced by supplying an auxiliary power to the cathode electrode.

However, a separate auxiliary electrode is needed for supplying the auxiliary power to the cathode electrode, and a mask process using a photomask is added for manufacturing a separate auxiliary electrode. The mask process accompanies sub processes such as cleaning, exposure, development, and etching processes, and when the mask process is added, a manufacturing time and the manufacturing cost for manufacturing a light emitting display device increase and a defect occurrence rate increases, causing a problem where a yield rate is reduced.

An aspect of the present disclosure is directed to providing a light emitting display device in which an auxiliary electrode may be provided without adding a mask process, and thus, a configuration and a manufacturing process may be simplified.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting display device including a circuit layer including a thin film transistor (TFT) and an auxiliary power electrode disposed on a substrate, at least one protection layer covering the circuit layer, and a contact portion passing through the at least one protection layer to expose a portion of the auxiliary power electrode, wherein the TFT includes an active layer, and the auxiliary power electrode is disposed on the same layer as the active layer.

In a light emitting display device according to the present disclosure, an auxiliary electrode may be provided without adding a mask process, and thus, a configuration and a manufacturing process may be simplified, the manufacturing cost for process optimization may be reduced, and productivity and reliability may be enhanced.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
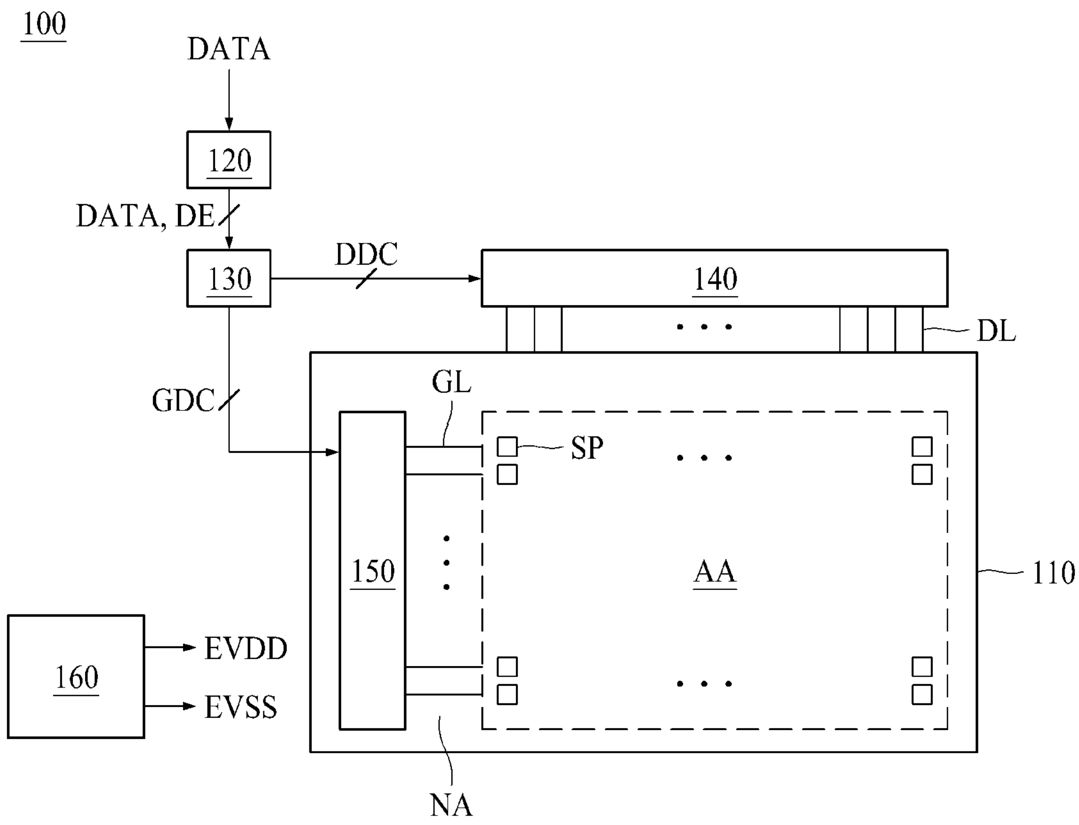
FIG. 1 is a block diagram schematically illustrating a light emitting display device according to an embodiment of the present disclosure.

Advantages and features of the present disclosure, and implementation methods thereof will be clarified through the following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there may not be any explicit description.

In describing a position relationship, for example, when the position relationship is described as 'upon~', 'above~', 'below~', and 'next to~', one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as approximate directions within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from one or more of the first item, the second item, and the third item as well as one or more of the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a preferred embodiment of a light emitting display device according to the present disclosure will be described in detail with reference to the accompanying drawings. Wherever possible, the same reference numbers will be used throughout the drawings to refer to the same or like parts. Since a scale of each of the elements shown in the accompanying drawings is different from an actual scale for convenience of description, the present disclosure is not limited to the shown scale.

FIG. 1 is a block diagram schematically illustrating a light emitting display device according to one embodiment of the present disclosure.

Referring to FIG. 1, the light emitting display device 100 according to one embodiment of the present disclosure may include a display panel 110, an image processor 120, a timing controller 130, a data driver 140, a scan driver 150, and a power supply portion 160 (also referred to as power supply portion).

The display panel 110 may display an image corresponding to a data signal DATA supplied from the data driver 140, a scan signal supplied from the scan driver 150, and power supplied from the power supply portion 160.

The display panel 110 may include a sub pixel SP disposed at every intersection of a plurality of gate lines GL and a plurality of data lines DL. A structure of the sub pixel SP may vary depending on the type of the display device 100.

For example, the sub pixels SP may be formed in a top emission method, a bottom emission method, or a dual emission method according to the structure. The sub pixels SP refer to unit capable of emitting light of their own color with or without a specific type of color filter. The sub pixels SP may include a red sub pixel, a green sub pixel, and a blue sub pixel. Alternatively, the sub pixel SP may include a red sub pixel, a blue sub pixel, a white sub pixel, and a green sub pixel. The sub pixels SP may have one or more different light emitting areas according to light emitting characteristics.

The one or more sub pixels SP may constitute one unit pixel. For example, one unit pixel may include red, green, and blue sub pixels, and the red, green, and blue sub pixels may be repeatedly arranged. Alternatively, one unit pixel may include red, green, blue, and white subpixels, wherein the red, green, blue and white subpixels may be repeatedly arranged, or the red, green, blue and white subpixels may be arranged in a quad type, for example in a group of four which may be square in shape. In the embodiment according to the present disclosure, the color type, arrangement type, arrangement order, etc. of the sub pixels may be configured in various forms depending on the luminous characteristics, the lifespan of the device, the spec of the device, and the like, whereby it is not limited thereto.

The display panel 110 may be divided into a display area AA for displaying an image by arranging the sub pixels SP, and a non-display area NA around the display area AA, but is not limited thereto. The scan driver 150 may be provided on the non-display area NA of the display panel 110. In addition, the non-display area NA may include a pad area and link line region.

The image processor 120 may output a data enable signal DE together with the data signal DATA supplied from the outside. The image processor 120 may output one or more of a vertical synchronization signal, a horizontal synchronization signal, and a clock signal in addition to the data enable signal DE.

The timing controller 130 may receive the data signal DATA as well as a driving signal from the image processor 120. The driving signal may include the data enable signal DE. Alternatively, the driving signal may include a vertical synchronization signal, a horizontal synchronization signal, and a clock signal. The timing controller 130 may output a data timing control signal DDC for controlling the operation timing of the data driver 140, and a gate timing control signal GDC for controlling the operation timing of the scan driver 150 based on the driving signal.

The data driver 140 may convert the data signal DATA into a gamma reference voltage by sampling and latching the data signal DATA supplied from the timing controller 130 in response to the data timing control signal DDC supplied from the timing controller 130, and may output the gamma reference voltage.

The data driver 140 may output the data signal DATA through the data lines DL. The data driver 140 may be implemented in the form of an integrated circuit IC. For example, the data driver 140 may be electrically connected to the pad area disposed in the non-display area NA of the display panel 110 through a flexible circuit film.

The scan driver 150 may output the scan signal in response to the gate timing control signal GDC supplied from the timing controller 130. The scan driver 150 may output the scan signal through the gate lines GL. The scan driver 150 may be implemented in the form of an integrated circuit IC or may be implemented in a gate-in-panel GIP scheme.

The power supply portion 160 may output a high potential voltage and a low potential voltage for driving the display panel 110. The power supply portion 160 may supply the high potential voltage to the display panel 110 through a first power line EVDD (driving power line or pixel power line), and may supply the low potential voltage to the display panel 110 through a second power line EVSS (auxiliary power line or common power line).

Figure 2:
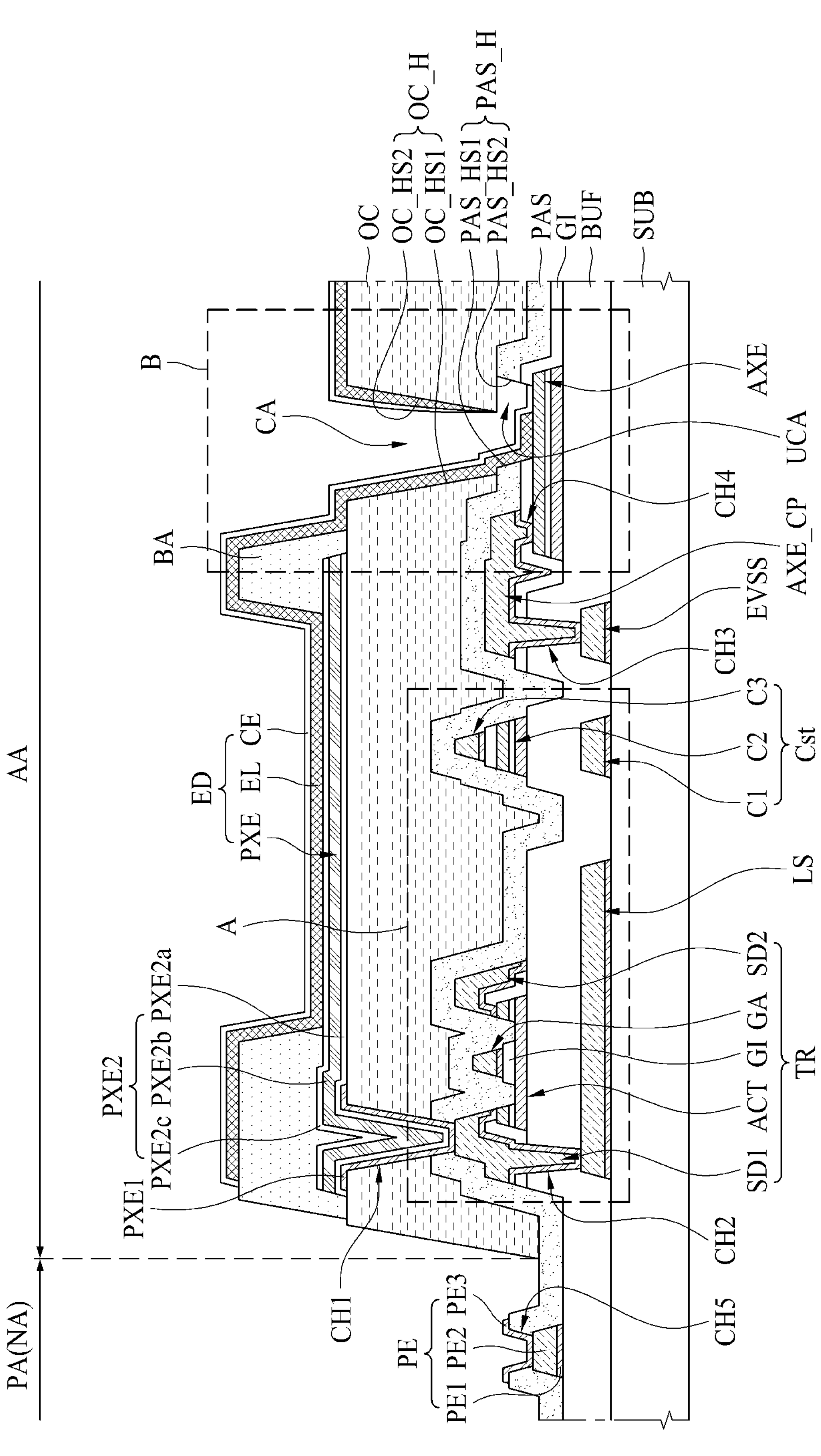
FIG. 2 is a cross-sectional view of a light emitting display device according to an embodiment of the present disclosure.
Figure 3:
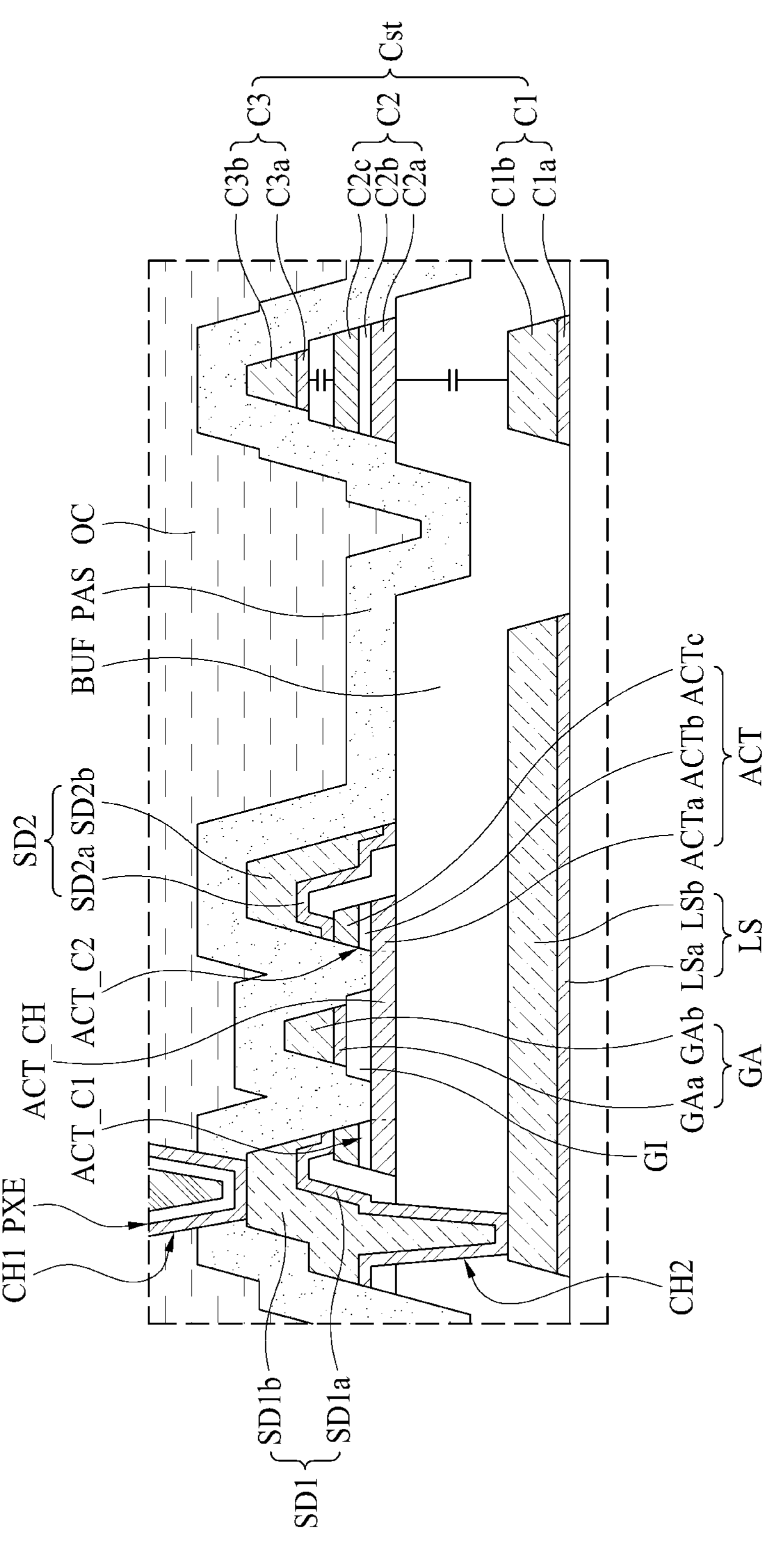
FIG. 3 is a diagram illustrating a region A of FIG. 2 according to an embodiment of the present disclosure.
Figure 4:
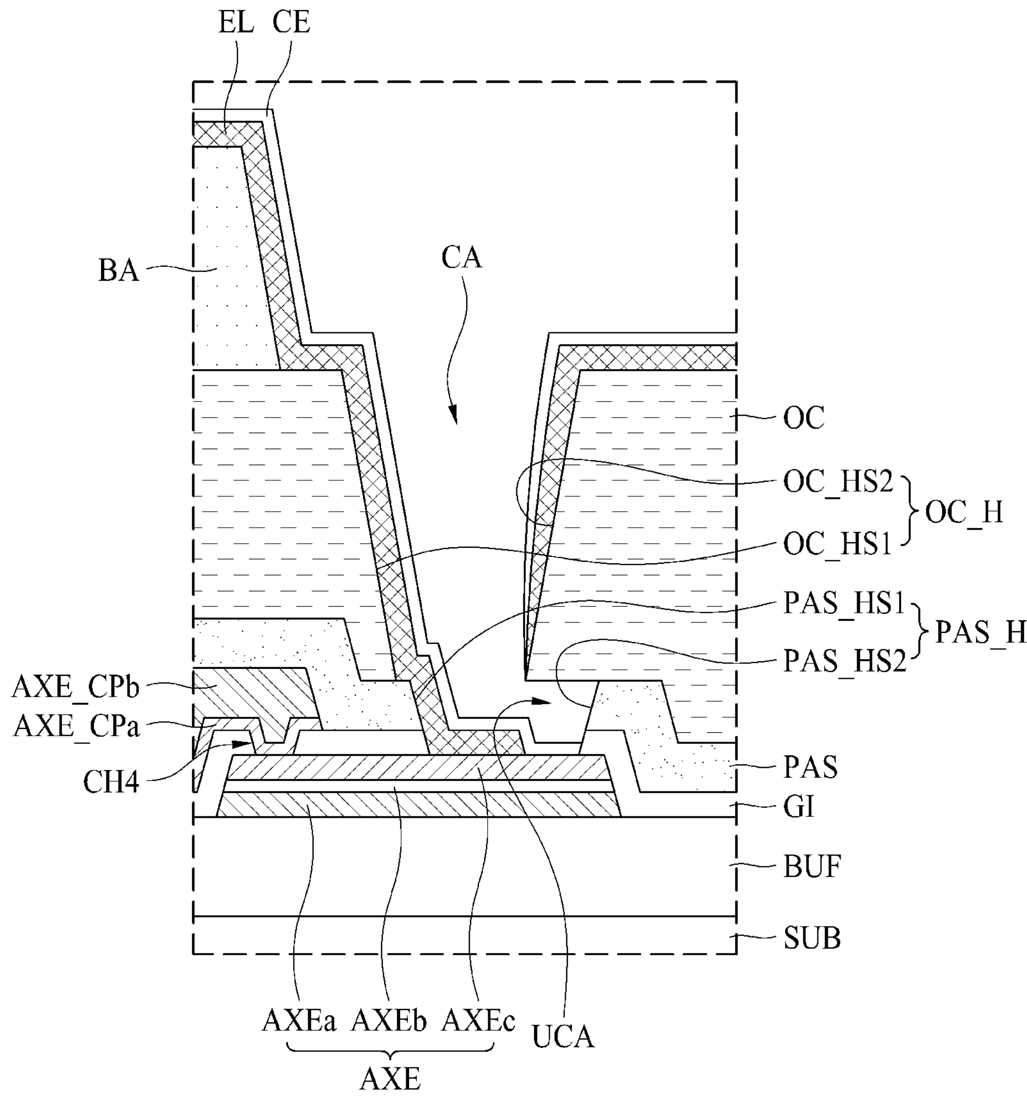
FIG. 4 is a diagram illustrating a region B of FIG. 2 according to an embodiment of the present disclosure.

FIG. 2 is a cross-sectional view of a light emitting display device 100 according to an embodiment of the present disclosure. FIG. 3 is a diagram illustrating a region A of FIG. 2. FIG. 4 is a diagram illustrating a region B of FIG. 2.

Referring to FIGS. 2 to 4, the light emitting display device 100 according to an embodiment of the present disclosure may include a display area AA and a pad area PA on a substrate SUB. For example, the pad area PA may be a portion of a non-display area NA at a periphery of the display area AA.

The light emitting display device 100 according to an embodiment of the present disclosure may include the substrate SUB, a light blocking layer LS, a buffer layer BUF, a thin film transistor (TFT) TR, a storage capacitor Cst, an auxiliary power electrode AXE, a gate insulation layer GI, a passivation layer PAS (or a first protection layer), an overcoat layer OC (or a second protection layer), a light emitting device ED, a bank layer BA, a contact portion CA, and a pad electrode PE.

The substrate SUB may be a base substrate and may include a glass or plastic material. For example, the substrate SUB may include a plastic material such as polyimide (PI), polyethylene terephthalate (PET), polyethylene naphthalate (PEN), or polycarbonate (PC) and may have a flexible characteristic, but embodiments of the present disclosure are not limited thereto.

A circuit element including various lines, the TFT TR, and the storage capacitor Cst may be provided on the substrate SUB for each of a plurality of subpixels SP. For example, the lines may include a gate line GL, a data line DL, a first power line EVDD (a driving power line or a pixel power line), a second power line EVSS (an auxiliary power line or a common power line), and a reference line. For example, the TFT TR may include a driving TFT, a switching TFT, and a sensing TFT, but embodiments of the present disclosure are not limited thereto.

The light blocking layer LS and the auxiliary power line EVSS (the second power line or the common power line) may be disposed on the substrate SUB.

The light blocking layer LS may be disposed to overlap the TFT TR. The light blocking layer LS may overlap an active layer ACT of the TFT TR. For example, the light blocking layer LS may be disposed to overlap a channel region ACT_CH (see FIG. 3) of the active layer ACT, as would be seen in a plan view. The light blocking layer LS may prevent or at least reduce external light from penetrating into the active layer ACT. Also, the auxiliary power line EVSS may apply an auxiliary power (or a low level voltage) to a common electrode CE to reduce a resistance of the common electrode CE.

The light blocking layer LS and the auxiliary power line EVSS may be formed of the same material on the same layer, on the substrate SUB. In this case, the light blocking layer LS and the auxiliary power line EVSS may be formed simultaneously through the same process, but embodiments of the present disclosure are not limited thereto.

The light blocking layer LS may be formed of one or more layers. For example, the light blocking layer LS may include a lower light blocking layer LSa and an upper light blocking layer LSb (see FIG. 3). Likewise, the auxiliary power line EVSS may be formed of one or more layers and may include a lower auxiliary power line including the same material as that of the lower light blocking layer LSa and an upper auxiliary power line including the same material as that of the upper light blocking layer LSb.

The lower light blocking layer LSa may prevent or at least reduce the corrosion of a lower surface of the upper light blocking layer LSb. For example, the lower light blocking layer LSa may include a material which is low in oxidation rate and is good in anticorrosion, and for example, may include molybdenum (Mo), titanium (Ti), or a Mo—Ti alloy (MoTi), but embodiments of the present disclosure are not limited thereto.

The upper light blocking layer LSb may include copper (Cu) which is metal having lower resistivity than that of the lower light blocking layer LSa. Also, the upper light blocking layer LSb may be configured to have a thickness which is greater than that of the lower light blocking layer LSa, so as to decrease a total resistance of the auxiliary power line, but embodiments of the present disclosure are not limited thereto.

The buffer layer BUF may be disposed on the substrate SUB to cover the light blocking layer LS and the auxiliary power line EVSS. The buffer layer BUF may be formed by stacking a single layer or a plurality of inorganic layers. For example, the buffer layer BUF may be formed of a single layer including silicon oxide (SiOx), silicon nitride (SiNx), and silicon oxynitride (SiOxNy). Alternatively, the buffer layer BUF may be formed of a multilayer where at least two of SiOx, SiNx, and SiOxNy are stacked. The buffer layer BUF may be formed all over an upper surface of the substrate SUB so as to block ions or impurities diffused from the substrate SUB and prevent or at least reduce the penetration of water into the light emitting device ED.

The TFT TR, second capacitor electrode C2 and third capacitor electrode C3 of the storage capacitor Cst, and the auxiliary power electrode AXE may be disposed on the buffer layer BUF. The TFT TR and the storage capacitor Cst may be disposed in each of the plurality of subpixels SP, on the buffer layer BUF. The auxiliary power electrode AXE may be disposed in each of the plurality of subpixels SP on the buffer layer BUF, or may be disposed between adjacent subpixels SP. For example, the auxiliary power electrode AXE may be provided for each of a plurality of subpixels SP configuring one unit pixel, or may be provided for each of an arbitrary plurality of subpixels. Also, the auxiliary power electrode AXE may be provided for each horizontal line parallel to a gate line GL, or may be disposed for each of an arbitrary plurality of horizontal lines, but embodiments of the present disclosure are not limited thereto.

The TFT TR may include the active layer ACT, a gate electrode GA, a first source/drain electrode SD1, and a second source/drain electrode SD2. Also, the storage capacitor Cst may include a first capacitor electrode C1 disposed on the same layer as the light blocking layer LS1, a second capacitor electrode C2 disposed on the same layer as the active layer ACT, and a third capacitor electrode C3 disposed on the same layer as the first source/drain electrode SD1 and the second source/drain electrode SD2. Also, the auxiliary power electrode AXE may be disposed on the same layer as the active layer ACT.

Referring to FIG. 3, the TFT TR according to an embodiment of the present disclosure may include the active layer ACT on the buffer layer BUF, the gate electrode GA overlapping the channel region ACT_CH of the active layer ACT with the gate insulation layer GI therebetween, the first source/drain electrode SD1 connected with a first region ACT_C1 of the active layer ACT, and the second source/drain electrode SD2 connected with a second region ACT_C2 of the active layer ACT.

The active layer ACT may be disposed on the buffer layer BUF. The active layer ACT may be formed of one or more layers. For example, the active layer ACT may include a first active layer ACTa on the buffer layer BUF, a second active layer ACTb on the first active layer ACTa, and a third active layer ACTc on the second active layer ACTb. The first active layer ACTa, the second active layer ACTb, and the third active layer ACTc may include different materials. For example, the first active layer ACTa may include an oxide semiconductor layer including at least one of indium gallium zinc oxide (IGZO), zinc tin oxide (ZTO), and zinc indium oxide (ZIO). Also, the second active layer ACTb may include a conductive oxide layer including at least one of indium tin oxide (ITO) and indium zinc oxide (IZO). Also, the third active layer ACTc may include a metal layer including at least one of Mo, Ti, and MoTi.

The active layer ACT may include the channel region ACT_CH overlapping the gate electrode GA with the gate insulation layer GI therebetween, the first region ACT_C1 connected with the first source/drain electrode SD1, and the second region ACT_C2 connected with the second source/drain electrode SD2. For example, the channel region ACT_CH may be disposed in a center region of the active layer ACT and may be a portion, exposed by removing the second and third active layers ACTb and ACTc on an upper surface of the first active layer ACTa. The first region ACT_C1 and the second region ACT_C2 may be arranged in parallel with the channel region ACT_CH therebetween and may each be a portion on which the first to third active layers ACTa, ACTb, and ACTc are stacked.

The gate insulation layer GI may be disposed on the active layer ACT. The gate insulation layer GI may be disposed on the channel region ACT_CH of the active layer ACT and may insulate the active layer ACT from the gate electrode GA. The gate insulation layer GI may include an inorganic insulating material. For example, the gate insulation layer GI may include SiOx, SiNx, SiOxNy, or a multilayer thereof, but embodiments of the present disclosure are not limited thereto.

The gate electrode GA, the first source/drain electrode SD1, and the second source/drain electrode SD2 may be disposed on the gate insulation layer GI. The gate electrode GA may overlap the channel region ACT_CH of the active layer ACT with the gate insulation layer GI therebetween. The first source/drain electrode SD1 and the second source/drain electrode SD2 may directly contact and be connected with the active layer ACT. According to an embodiment of the present disclosure, the gate electrode GA, the first source/drain electrode SD1, and the second source/drain electrode SD2 may include the same material. For example, the gate electrode GA, the first source/drain electrode SD1, and the second source/drain electrode SD2 may be formed simultaneously through the same process. The gate insulation layer GI may be patterned along with the gate electrode GA, the first source/drain electrode SD1, and the second source/drain electrode SD2, and thus, may be disposed under the gate electrode GA, the first source/drain electrode SD1, and the second source/drain electrode SD2.

The first source/drain electrode SD1 or the second source/drain electrode SD2 may be connected with the light blocking layer LS through a contact hole CH2 passing through the gate insulation layer GI and the buffer layer BUF. For example, the light blocking layer LS may include a conductive material, and when the light blocking layer LS is floated, the active layer ACT may be adversely affected, for example when the light blocking layer LS is floated, additional parasitic capacitance may be present which can affect pixel/subpixel operation. Accordingly, the first source/drain electrode SD1 or the second source/drain electrode SD2 may be electrically connected with the light blocking layer LS to allow the light blocking layer LS not to be floated, thereby preventing or at least reducing the adverse effect on the active layer ACT.

Each of the gate electrode GA, the first source/drain electrode SD1, and the second source/drain electrode SD2 may be configured with one or more layers. For example, the gate electrode GA may include a lower gate electrode GAa and an upper gate electrode Gab. Also, the first source/drain electrode SD1 may include a lower first source/drain electrode SD1*a* and an upper first source/drain electrode SD1*b*. Also, the second source/drain electrode SD2 may include a lower second source/drain electrode SD2*a* and an upper second source/drain electrode SD2*b*.

The lower gate electrode GAa, the lower first source/drain electrode SD1*a*, and the lower second source/drain electrode SD2*a* may prevent or at least reduce the corrosion of lower surfaces of the upper gate electrode GAb, the upper first source/drain electrode SD1*b*, and the upper second source/drain electrode SD2*b*. For example, the lower gate electrode GAa, the lower first source/drain electrode SD1*a*, and the lower second source/drain electrode SD2*a* may include a material which is lower in oxidation rate and better in anticorrosion than the upper gate electrode GAb, the upper first source/drain electrode SD1*b*, and the upper second source/drain electrode SD2*b*, and for example, may include Mo, Ti, or MoTi, but embodiments of the present disclosure are not limited thereto. The upper gate electrode GAb, the upper first source/drain electrode SD1*b*, and the upper second source/drain electrode SD2*b* may include Cu which is a metal which is lower in resistivity than the lower gate electrode GAa, the lower first source/drain electrode SD1*a*, and the lower second source/drain electrode SD2*a*. Also, the upper gate electrode GAb, the upper first source/drain electrode SD1*b*, and the upper second source/drain electrode SD2*b* may be configured to have a thickness which is greater than that of each of the lower gate electrode GAa, the lower first source/drain electrode SD1*a*, and the lower second source/drain electrode SD2*a*, so as to reduce a total resistance, but embodiments of the present disclosure are not limited thereto.

The gate electrode GA, the first source/drain electrode SD1, and the second source/drain electrode SD2 according to an embodiment of the present disclosure may be formed simultaneously through the same process, and thus, an interlayer insulation layer formed between the gate electrode GA and the first and second source/drain electrodes SD1 and SD2 may be omitted. Accordingly, the number of manufacturing processes may decrease, and thus, a manufacturing process may be simplified, the manufacturing cost for process optimization may be reduced, and productivity and reliability may be enhanced.

Referring to FIG. 3, the storage capacitor Cst according to an embodiment of the present disclosure may include a first capacitor electrode C1 disposed on the same layer as the light blocking layer LS on the substrate SUB, a second capacitor electrode C2 disposed on the same layer as the active layer ACT on the buffer layer BUF, and a third capacitor electrode C3 disposed on the same layer as the first and second source/drain electrodes SD1 and SD2 on the gate insulation layer GI. The storage capacitor Cst may form a capacitance as the buffer layer BUF is disposed between the first capacitor electrode C1 and the second capacitor electrode C2. Also, the gate insulation layer GI may be disposed between the second capacitor electrode C2 and the third capacitor electrode C3 to form a capacitance. Accordingly, the storage capacitor Cst may function as a double capacitor.

The first capacitor electrode C1 may be formed of the same material on the same layer as the light blocking layer LS on the substrate SUB. The first capacitor electrode C1 may be formed simultaneously through the same process as the light blocking layer LS. The first capacitor electrode C1, like the light blocking layer LS, may be configured with one or more layers. For example, the lower first capacitor electrode C1*a* may include a material which is lower in oxidation rate and better in anticorrosion than the upper first capacitor electrode C1*b*, and for example, may include Mo, Ti, or MoTi. The upper first capacitor electrode C1*b* may include Cu which is a metal which is lower in resistivity than the lower first capacitor electrode C1*a*. Also, the upper first capacitor electrode C1*b* may be configured to have a thickness which is greater than that of the lower first capacitor electrode C1*a*, so as to reduce a total resistance, but embodiments of the present disclosure are not limited thereto.

The second capacitor electrode C2 may be formed of the same material on the same layer as the active layer ACT on the buffer layer BUF. The second capacitor electrode C2 may be formed simultaneously through the same process as the active layer ACT. The second capacitor electrode C2, like the active layer ACT, may be configured with one or more layers. For example, the second capacitor electrode C2 may include a 2-$1^{st}$ capacitor electrode C2*a*, a 2-$2^{nd}$ capacitor electrode C2*b*, and a 2-$3^{rd}$ capacitor electrode C2*c*. The 2-$1^{st}$ capacitor electrode C2*a*, the 2-$2^{nd}$ capacitor electrode C2*b*, and the 2-$3^{rd}$ capacitor electrode C2*c* may include different materials. For example, the 2-$1^{st}$ capacitor electrode C2*a* may include an oxide semiconductor layer including at least one of IGZO, ZTO, and ZIO. Also, the 2-$2^{nd}$ capacitor electrode C2*b* may include a conductive oxide layer including at least one of ITO and IZO. Also, the 2-$3^{rd}$ capacitor electrode C2*c* may include a metal layer including at least one of Mo, Ti, and MoTi.

The third capacitor electrode C3 may be formed of the same material on the same layer as the first and second source/drain electrodes SD1 and SD2 on the gate insulation layer GI. Also, the third capacitor electrode C3 may be formed of the same material on the same layer as the gate electrode GA on the gate insulation layer GI. The third capacitor electrode C3 may be formed simultaneously through the same process as the gate electrode GA and the first and second source/drain electrodes SD1 and SD2. The third capacitor electrode C3, like the gate electrode GA and the first and second source/drain electrodes SD1 and SD2, may be configured with one or more layers. For example, the third capacitor electrode C3 may include a lower third capacitor electrode C3*a* and an upper third capacitor electrode C3*b*. The lower third capacitor electrode C3*a* may include a material which is lower in oxidation rate and better in anticorrosion than the upper third capacitor electrode C3*b*, and for example, may include Mo, Ti, or MoTi. The upper third capacitor electrode C3*b* may include Cu which is a metal which is lower in resistivity than the lower third capacitor electrode C3*a*. Also, the upper third capacitor electrode C3*b* may be configured to have a thickness which is greater than that of the lower third capacitor electrode C3*a*, so as to reduce a total resistance, but embodiments of the present disclosure are not limited thereto.

Referring to FIG. 4, the auxiliary power electrode AXE according to an embodiment of the present disclosure may be formed of the same material on the same layer as the active layer ACT on the buffer layer BUF. The auxiliary power electrode AXE, like the active layer ACT, may be configured with one or more layers. For example, the auxiliary power electrode AXE may include a first auxiliary power electrode AXEa, a second auxiliary power electrode AXEb, and a third auxiliary power electrode AXEc. The first auxiliary power electrode AXEa, the second auxiliary power electrode AXEb, and the third auxiliary power electrode AXEc may include different materials. For example, the first auxiliary power electrode AXEa may include an oxide semiconductor layer including at least one of IGZO, ZTO, and ZIO. Also, the second auxiliary power electrode AXEb may include a conductive oxide layer including at least one of ITO and IZO. Also, the third auxiliary power electrode AXEc may include a metal layer including at least one of Mo, Ti, and MoTi. The auxiliary power electrode AXE according to an embodiment of the present disclosure may be formed simultaneously through the same process as the active layer ACT and may include a material which is not oxidized or corroded even when the third auxiliary power electrode AXEc disposed on an uppermost layer of the auxiliary power electrode AXE is exposed at the outside, and thus, a separate process for forming an auxiliary power electrode may not be added. Accordingly, the number of manufacturing processes may decrease, and thus, a manufacturing process may be simplified, the manufacturing cost for process optimization may be reduced, and productivity and reliability may be enhanced.

The auxiliary power electrode AXE according to an embodiment of the present disclosure may be connected with the auxiliary power line EVSS and may apply the auxiliary power (a low level voltage or a common voltage), supplied from the auxiliary power line EVSS, to a common electrode CE (a cathode electrode or a second electrode). The auxiliary power electrode AXE may reduce a resistance of the common electrode CE along with the auxiliary power line EVSS.

According to an embodiment of the present disclosure, an auxiliary power connection pattern AXE_CP may be provided between the auxiliary power electrode AXE and the auxiliary power line EVSS. The auxiliary power connection pattern AXE_CP may be formed of the same material on the same layer as the first and second source/drain electrodes SD1 and SD2 on the gate insulation layer GI. Also, the auxiliary power connection pattern AXE_CP may be formed of the same material on the same layer as the gate electrode GA on the gate insulation layer GI.

One end of the auxiliary power connection pattern AXE_CP may be connected with the auxiliary power line EVSS through a contact hole CH3 passing through the gate insulation layer GI and the buffer layer BUF. Also, the other end of the auxiliary power connection pattern AXE_CP may be connected with the auxiliary power electrode AXE through a contact hole CH4 passing through the gate insulation layer GI. The auxiliary power electrode AXE may be electrically connected with the auxiliary power line EVSS through the auxiliary power connection pattern AXE_CP.

The auxiliary power connection pattern AXE_CP may be formed simultaneously through the same process as the gate electrode GA and the first and second source/drain electrodes SD1 and SD2. The auxiliary power connection pattern AXE_CP, like the gate electrode GA and the first and second source/drain electrodes SD1 and SD2, may be configured with one or more layers. For example, the auxiliary power connection pattern AXE_CP may include a lower auxiliary power connection pattern AXE_CPa and an upper auxiliary power connection pattern AXE_CPb. The lower auxiliary power connection pattern AXE_CPa may include a material which is lower in oxidation rate and better in anticorrosion than the upper auxiliary power connection pattern AXE_CPb, and for example, may include Mo, Ti, or MoTi. The upper auxiliary power connection pattern AXE_CPb may include Cu which is metal which is lower in resistivity than the lower auxiliary power connection pattern AXE_CPa. Also, the upper auxiliary power connection pattern AXE_CPb may be configured to have a thickness which is greater than that of the lower auxiliary power connection pattern AXE_CPa, so as to reduce a total resistance, but embodiments of the present disclosure are not limited thereto.

The TFT TR, the storage capacitor Cst, and the auxiliary power electrode AXE may configure a circuit layer (or a TFT array layer).

The passivation layer PAS (or the first protection layer) may be disposed on the circuit layer including the TFT TR, the storage capacitor Cst, and the auxiliary power electrode AXE. The passivation layer PAS may be provided to cover the TFT TR, the storage capacitor Cst, and the auxiliary power electrode AXE. The passivation layer PAS may protect the TFT TR, the storage capacitor Cst, and the auxiliary power electrode AXE of the circuit layer and may include an inorganic insulating material. For example, the passivation layer PAS may include SiOx, SiNx, SiOxNy, or a multilayer thereof, but embodiments of the present disclosure are not limited thereto. Also, the passivation layer PAS may be disposed to extend up to the pad area PA from the display area AA. For example, the passivation layer PAS may be formed to cover a portion of the pad electrode PE disposed in the pad area PA.

The overcoat layer OC (a second protection layer or a planarization layer) may be disposed on the passivation layer PAS. The overcoat layer OC may planarize a lower step height and may include an organic insulating material. For example, the overcoat layer OC may include at least one of organic materials such as photo acryl, polyimide, benzocyclobutene resin, and acrylate, but embodiments of the present disclosure are not limited thereto.

A pixel electrode PXE (an anode electrode or a first electrode) may be disposed on the overcoat layer OC. The pixel electrode PXE may be disposed in each of the plurality of subpixels SP on the overcoat layer OC. The pixel electrode PXE may be connected with the first source/drain electrode SD1 or the second source/drain electrode SD2 of the TFT TR through a contact hole CH1 passing through the overcoat layer OC and the passivation layer PAS. An emission layer EL (or an organic emission layer) and the common electrode CE (a cathode electrode or a second electrode) may be disposed on the pixel electrode PXE. The pixel electrode PXE, the emission layer EL, and the common electrode CE may configure the light emitting device ED.

The pixel electrode PXE may include metal, an alloy thereof, or a combination of metal and oxide metal. For example, the pixel electrode PXE may be formed in a multi-layer structure including a transparent conductive layer and an opaque conductive layer which is high in reflection efficiency. Also, the pixel electrode PXE may include a material which is low in oxidation rate and is good in anticorrosion. For example, the pixel electrode PXE may include a first pixel electrode PXE1 on the contact hole CH1 and a second pixel electrode PXE2 which is on the first pixel electrode PXE1 and is disposed on an upper surface of the overcoat layer OC.

The first pixel electrode PXE1 may include a material which is lower in oxidation rate and better in anticorrosion than the second pixel electrode PXE2, and for example, may include Mo, Ti, or MoTi. The first pixel electrode PXE1 may be disposed in the contact hole CH1 and a portion of the upper surface of the overcoat layer OC at a periphery of the contact hole CH1.

The second pixel electrode PXE2 may be formed in a multi-layer structure including a transparent conductive layer and an opaque conductive layer which is high in reflection efficiency. The second pixel electrode PXE2 may include a 2-1$^{st}$ pixel electrode PXE2*a*, a 2-2$^{nd}$ pixel electrode PXE2*b*, and a 2-3$^{rd}$ pixel electrode PXE2*c*. The 2-1$^{st}$ pixel electrode PXE2*a* and the 2-3$^{rd}$ pixel electrode PXE2*c* may be provided at a lower portion and an upper portion with respect to the 2-2$^{nd}$ pixel electrode PXE2*b* therebetween. The 2-1$^{st}$ pixel electrode PXE2*a* and the 2-3$^{rd}$ pixel electrode PXE2*c* may include a transparent conductive layer. For example, each of the 2-1$^{st}$ pixel electrode PXE2*a* and the 2-3$^{rd}$ pixel electrode PXE2*c* may include a material, having a relatively large work function value, such as indium tin oxide (ITO) or indium zinc oxide (IZO). The 2-2$^{nd}$ pixel electrode PXE2*b* may be provided between the 2-1$^{st}$ pixel electrode PXE2*a* and the 2-3$^{rd}$ pixel electrode PXE2*c*. The 2-2$^{nd}$ pixel electrode PXE2*b* may include an opaque conductive layer which is lower in resistivity than the 2-1$^{st}$ pixel electrode PXE2*a* and the 2-3$^{rd}$ pixel electrode PXE2*c*. For example, the 2-2$^{nd}$ pixel electrode PXE2*b* may be formed of a single layer or a multilayer including one material, selected from among the group comprising silver (Ag), aluminum (Al), copper (Cu), molybdenum (Mo), titanium (Ti), nickel (Ni), chromium (Cr), and tungsten (W), or an alloy thereof. The 2-2$^{nd}$ pixel electrode PXE2*b* may be configured to have a thickness which is greater than that of each of the 2-1$^{st}$ pixel electrode PXE2*a* and the 2-3$^{rd}$ pixel electrode PXE2*c*, so as to reduce a total resistance of the pixel electrode PXE, but embodiments of the present disclosure are not limited thereto.

The bank layer BA may be disposed on the pixel electrode PXE and the overcoat layer OC. The bank layer BA may cover an edge portion of the pixel electrode PXE and may define an opening portion of the subpixel SP. The bank layer BA may include an organic material such as polyimide, acrylate, or benzocyclobutene series resin, but embodiments of the present disclosure are not limited thereto. A center portion of the pixel electrode PXE exposed by the bank layer BA may be defined as an emission region. Also, a portion covered by the bank layer BA may be defined as a non-emission region.

The contact portion CA may pass through the passivation layer PAS and the overcoat layer OC to expose a portion of the auxiliary power electrode AXE. The contact portion CA may include a first opening portion PAS_H formed in the passivation layer PAS and a second opening portion OC_H formed in the overcoat layer OC. For example, the first opening portion PAS_H may include a first slope surface PAS_HS1 and a second slope surface PAS_HS2. The second opening portion OC_H may include a first slope surface OC_HS1 and a second slope surface OC_HS2. The first opening portion PAS_H of the passivation layer PAS and the second opening portion OC_H of the overcoat layer OC may configure an undercut region UCA on the auxiliary power electrode AXE.

The first opening portion PAS_H of the passivation layer PAS may be formed to expose a portion of the auxiliary power electrode AXE. The second opening portion OC_H of the overcoat layer OC may be formed to expose a portion of the auxiliary power electrode AXE. The second opening portion OC_H of the overcoat layer OC may include a protrusion portion overlapping at least a portion of the first opening portion PAS_H of the passivation layer PAS. The second opening portion OC_H of the overcoat layer OC may be formed in a shape in which the second slope surface OC_HS2 of the second opening portion OC_H protrudes from the second slope surface PAS_HS2 of the first opening portion PAS_H of the passivation layer PAS. The undercut region UCA may be formed under the second slope surface OC_HS2 of the second opening portion OC_H of the overcoat layer OC protruding from the second slope surface PAS_HS2 of the first opening portion PAS_H of the passivation layer PAS.

The emission layer EL may be disposed on the pixel electrode PXE and the bank layer BA. The emission layer EL may be disposed on the auxiliary power electrode AXE exposed through the contact portion CA. In the contact portion CA, the second opening portion OC_H of the overcoat layer OC may include a portion which, in size, is greater than or equal to the first opening portion PAS_H of the passivation layer PAS. Here, a portion of an upper surface of the passivation layer PAS may be exposed by the first slope surface OC_HS1 of the second opening portion OC_H of the overcoat layer OC. Therefore, a stepped region may be formed along the first slope surface OC_HS1 of the second opening portion OC_H of the overcoat layer OC, the upper surface of the passivation layer PAS, and the first slope surface PAS_HS1 of the first opening portion PAS_H of the passivation layer PAS. The emission layer EL may be partially formed on the auxiliary power electrode AXE along a stepped region formed by the overcoat layer OC and the passivation layer PAS in the contact portion CA. Also, in the contact portion CA, the second opening portion OC_H of the overcoat layer OC may include a portion which protrudes and overlaps at least a portion of the first opening portion PAS_H of the passivation layer PAS. Here, the undercut region UCA may be formed under the second slope surface OC_HS2 of the second opening portion OC_H of the overcoat layer OC protruding from the second slope surface PAS_HS2 of the first opening portion PAS_H of the passivation layer PAS. The emission layer EL may not be disposed on the auxiliary power electrode AXE corresponding to the undercut region UCA formed by the overcoat layer OC and the passivation layer PAS in the contact portion CA. The emission layer EL may include a material which is not good in step coverage, and thus, may be formed up to only a portion except the undercut region UCA and may be disconnected without being formed on the auxiliary power electrode AXE corresponding to the undercut region UCA. As used herein, step coverage refers to uniformity of thickness over a step, and not good step coverage refers to the uniformity of thickness not being consistent. Accordingly, the emission layer EL may be disconnected in the undercut region UCA, and thus, an upper surface of the auxiliary power electrode AXE corresponding to the undercut region UCA may be exposed and the common electrode CE may directly contact and be electrically connected with the auxiliary power electrode AXE. This helps to mitigate voltage drop occurring due to an increase in resistance of the common electrode CE (also known as a cathode electrode) in the light emitting display device.

The common electrode CE (the cathode electrode or the second electrode) may be disposed on the emission layer EL. The common electrode CE may overlap the pixel electrode PXE and the emission layer EL to configure the light emitting device ED. The common electrode CE may be widely provided on an entire surface of the substrate SUB. The common electrode CE may include a transparent conductive material such as ITO or IZO, or may include Ag, Al, magnesium (Mg), calcium (Ca), or an alloy thereof having a thin thickness enabling transmission of light, but embodiments of the present disclosure are not limited thereto. The common electrode CE may be provided on the emission layer EL along the stepped region formed by the overcoat layer OC and the passivation layer PAS in the contact portion CA. The common electrode CE may be provided on the auxiliary power electrode AXE corresponding to the undercut region UCA formed by the overcoat layer OC and the passivation layer PAS in the contact portion CA. The common electrode CE may be provided on the auxiliary power electrode AXE exposed by the emission layer EL in the undercut region UCA. The common electrode CE may include a material which is better in step coverage than the emission layer EL, and thus, may be provided up to the auxiliary power electrode AXE of the undercut region UCA where the emission layer EL is not provided. The common electrode CE may directly contact and be electrically connected with the auxiliary power electrode AXE.

In the light emitting display device 100 according to an embodiment of the present disclosure, a pad electrode PE may be disposed in the pad area PA on the substrate SUB.

The buffer layer BUF may be disposed in the pad area PA on the substrate SUB. The pad electrode PE may be disposed on the buffer layer BUF. The pad electrode PE may be configured with one or more layers. For example, the pad electrode PE may include a first pad electrode PE1, a second pad electrode PE2, and a third pad electrode PE3.

The first pad electrode PE1 and the second pad electrode PE2 may be disposed on the buffer layer BUF. The first pad electrode PE1 and the second pad electrode PE2 may be formed of the same material on a layer which differs from the gate electrode GA, the first source/drain electrode SD1, and the second source/drain electrode SD2. For example, the gate insulation layer GI may not be provided in the pad area PA on the substrate SUB, and the first pad electrode PE1 and the second pad electrode PE2 may be formed simultaneously through the same process as the gate electrode GA, the first source/drain electrode SD1, and the second source/drain electrode SD2 on the gate insulation layer GI on the buffer layer BUF. The first pad electrode PE1 may include a material which is lower in oxidation rate and better in anticorrosion than the second pad electrode PE2, and for example, may include Mo, Ti, or MoTi. The second pad electrode PE2 may include Cu which is metal which is lower in resistivity than the first pad electrode PE1. Also, the second pad electrode PE2 may be configured to have a thickness which is greater than that of the first pad electrode PE1, so as to reduce a total resistance, but embodiments of the present disclosure are not limited thereto.

The passivation layer PAS including a contact hole CH5 exposing a portion of an upper surface of the second pad electrode PE2 may be disposed on the first pad electrode PE1 and the second pad electrode PE2. The third pad electrode PE3, which is connected with the second pad electrode PE2 through the contact hole CH5 and is formed of the same material as that of the first pixel electrode PXE1, may be disposed on the passivation layer PAS.

The third pad electrode PE3 may be formed of the same material on a layer which differs from the first pixel electrode PXE1 of the pixel electrode PXE. For example, the overcoat layer OC may not be provided in the pad area PA on the substrate SUB, and the third pad electrode PE3 may be formed simultaneously through the same process as the first pixel electrode PXE1 on the overcoat layer OC on the passivation layer PAS. The third pad electrode PE3, like the first pixel electrode PXE1, may include a material which is low in oxidation rate and is good in anticorrosion, and for example, may include Mo, Ti, or MoTi. The pad electrode PE according to an embodiment of the present disclosure may include a material which is not oxidized or corroded even when the third pad electrode PE3 disposed on an uppermost layer of the pad electrode PE is exposed at the outside, and thus, may prevent or at least reduce the second pad electrode PE2 from being oxidized or corroded.

Figure 5:
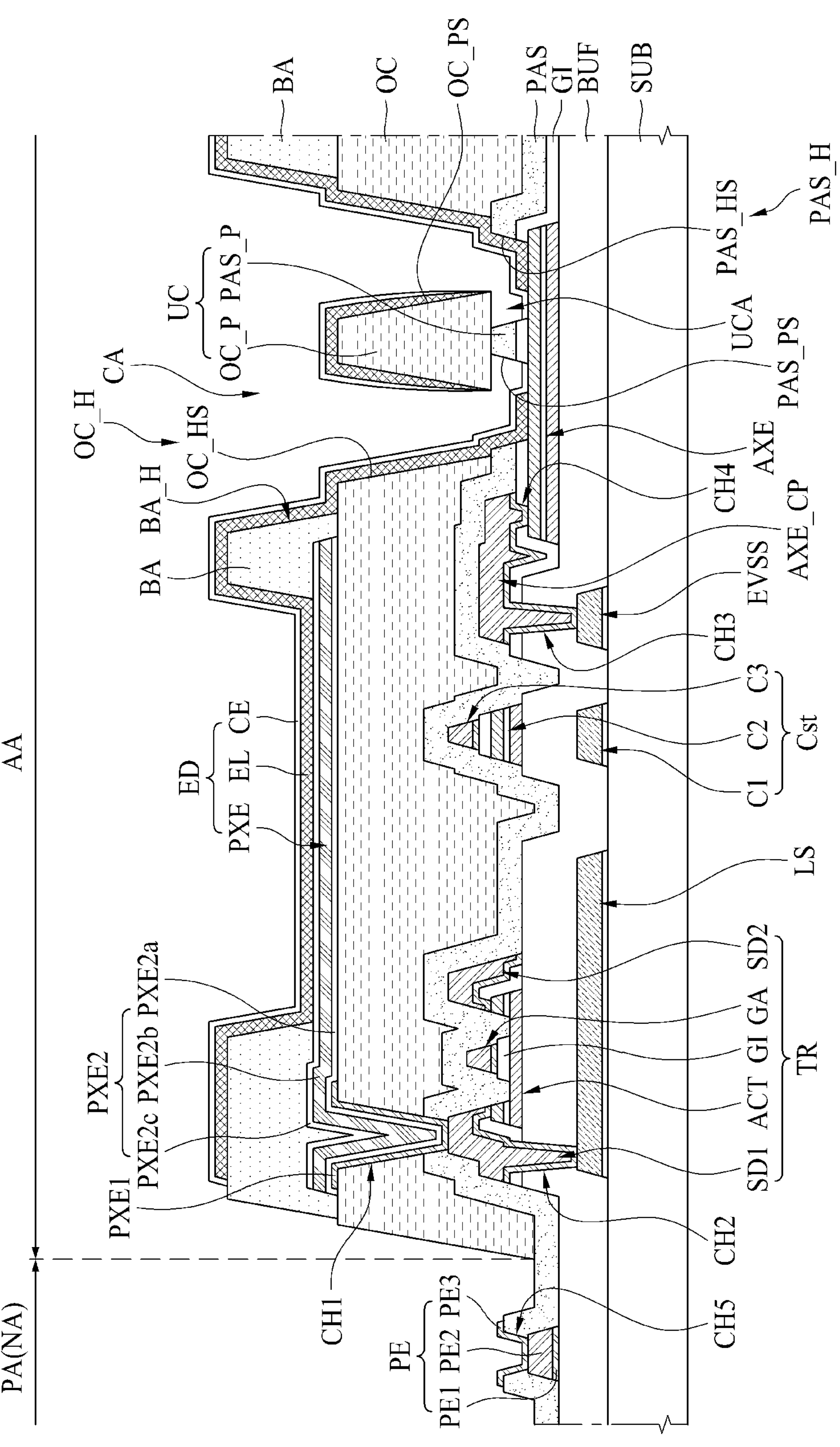
FIG. 5 is a cross-sectional view of a light emitting display device according to another embodiment of the present disclosure.

FIG. 5 is a cross-sectional view of a light emitting display device 100 according to another embodiment of the present disclosure. FIG. 5 illustrates an embodiment implemented by modifying a configuration of a contact portion CA in the light emitting display device 100 described above with reference to FIGS. 2 to 4. Hereinafter, therefore, repeated descriptions of the other elements except a modified configuration of a contact portion CA and relevant elements are omitted or will be briefly given.

Referring to FIG. 5, the light emitting display device 100 according to another embodiment of the present disclosure may include a contact portion CA which exposes a portion of an auxiliary power electrode AXE.

The contact portion CA may pass through a passivation layer PAS, an overcoat layer OC, and a bank layer BA to expose a portion of the auxiliary power electrode AXE. An undercut structure UC including an undercut region UCA may be provided on the auxiliary power electrode AXE exposed by the contact portion CA.

The passivation layer PAS may include a first opening portion PAS_H which exposes a portion of the auxiliary power electrode AXE. The undercut structure UC including the undercut region UCA may be disposed on an upper surface of the auxiliary power electrode AXE exposed by the first opening portion PAS_H of the passivation layer PAS. For example, the first opening portion PAS_H of the passivation layer PAS may be formed in a shape surrounding a periphery of the undercut structure UC with the undercut structure UC therebetween.

The overcoat layer OC may be disposed on the passivation layer PAS and may include a second opening portion OC_H which, in size, is greater than or equal to the first opening portion PAS_H of the passivation layer PAS. For example, the second opening portion OC_H of the overcoat layer OC may be formed in a shape corresponding to a perimeter of the first opening portion PAS_H of the passivation layer PAS and may have a size which is greater than that of the first opening portion PAS_H. A portion of the passivation layer PAS may be exposed through the second opening portion OC_H of the overcoat layer OC. For example, the second opening portion OC_H of the overcoat layer OC may be formed in a shape surrounding the periphery of the undercut structure UC with the undercut structure UC therebetween.

The bank layer BA may be disposed on the overcoat layer OC and the passivation layer PAS and may include a third opening portion BA_H which is greater than or equal to the second opening portion OC_H of the overcoat layer OC. For example, the third opening portion BA_H of the bank layer BA may be formed in a corresponding shape along a perimeter of the second opening portion OC_H of the overcoat layer OC and may have a size which is greater than that of the second opening portion OC_H. A portion of the overcoat layer OC may be exposed through the third opening portion BA_H of the bank layer BA. For example, the third opening portion BA_H of the bank layer BA may be formed in a shape surrounding a periphery of the undercut structure UC with the undercut structure UC therebetween.

The first opening portion PAS_H of the passivation layer PAS, the second opening portion OC_H of the overcoat layer OC, and the third opening portion BA_H of the bank layer BA may include a stepped region which is formed along a lateral surface of the third opening portion BA_H of the bank layer BA, the upper surface of the overcoat layer OC, a lateral surface of the second opening portion OC_H, the upper surface of the passivation layer PAS, and a lateral surface of the first opening portion PAS_H.

The undercut structure UC may be disposed on a portion of the auxiliary power electrode AXE and may include an undercut region UCA. The undercut structure UC may be formed to have an island pattern on a portion of the auxiliary power electrode AXE, and the auxiliary power electrode AXE exposed at a peripheral perimeter of the undercut structure UC may contact and be electrically connected with a common electrode CE (a cathode electrode or a second electrode).

The undercut structure UC may include a first pattern PAS_P and a second pattern OC_P. The first pattern PAS_P and the second pattern OC_P of the undercut structure UC may include an inorganic insulating material or an organic insulating material. For example, the first pattern PAS_P of the undercut structure UC may include the same material as that of the passivation layer PAS. The second pattern OC_P of the undercut structure UC may include the same material as that of the overcoat layer OC.

The first pattern PAS_P may be formed on an upper surface of the auxiliary power electrode AXE. The first pattern PAS_P may be formed with an island pattern and may include an upper surface which has a first width and contacts the second pattern OC_P, a lower surface which has a second width greater than the first width and contacts the auxiliary power electrode AXE, and a slope surface PAS_PS between the upper surface and the lower surface. For example, a slope surface PAS_PS of the first pattern PAS_P may be arranged at the same slope angle as that of a slope surface PAS_HS of the first opening portion PAS_H of the passivation layer PAS. The same slope angle allows for a simpler, or the same, manufacturing process. For example, the first pattern PAS_P may be formed of the same material on the same layer as the passivation layer PAS. The first pattern PAS_P may be formed together through the same process as the first opening portion PAS_H of the passivation layer PAS.

The second pattern OC_P may be formed on an upper surface of the first pattern PAS_P. The second pattern OC_P may be supported by the first pattern PAS_P. The second pattern OC_P may be formed on the first pattern PAS_P to have an island pattern and may be formed in a shape which protrudes from the first pattern PAS_P. The undercut region UCA may be formed under an edge of the second pattern OC_P protruding from a lateral surface of the first pattern PAS_P. The second pattern OC_P may have a width which is greater than the first and second widths of the first pattern PAS_P and may include a lower surface which contacts the first pattern PAS_P, an upper surface which is smaller in width than the lower surface, and a slope surface OC_PS between the upper surface and the lower surface. For example, a slope surface OC_PS of the second pattern OC_P may be arranged at the same slope angle as that of a slope surface OC_HS of the second opening portion OC_H of the overcoat layer OC. For example, the second pattern OC_P may be formed of the same material on the same layer as the overcoat layer OC. The second pattern OC_P may be formed together through the same process as the second opening portion OC_H of the overcoat layer OC.

The emission layer EL may be disposed on the pixel electrode PXE and the bank layer BA. Also, the emission layer EL may be disposed on the second pattern OC_P of the undercut structure UC. The emission layer EL may be partially disposed on the auxiliary power electrode AXE exposed through the contact portion CA. The emission layer EL may be partially formed on the auxiliary power electrode AXE along a stepped region formed by the bank layer BA, the overcoat layer OC, and the passivation layer PAS in the contact portion CA. The emission layer EL may be disconnected in the undercut region UCA by the undercut structure UC disposed at the contact portion CA. For example, the emission layer EL may include a material which is not good in step coverage. Accordingly, the emission layer EL may have an area which is disposed on the auxiliary power electrode AXE and is minimized or at least reduce by the undercut structure UC and may be disconnected in the undercut region UCA of the undercut structure UC.

The common electrode CE (the cathode electrode or the second electrode) may be disposed on the emission layer EL. The common electrode CE may be disposed on the emission layer EL on the second pattern OC_P of the undercut structure UC. The common electrode CE may overlap the pixel electrode PXE and the emission layer EL to configure a light emitting device ED. The common electrode CE may be widely provided on an entire surface of the substrate SUB. The common electrode CE may include a transparent conductive material such as ITO or IZO, or may include Ag, Al, Mg, Ca, or an alloy thereof having a thin thickness enabling transmission of light, but embodiments of the present disclosure are not limited thereto.

The common electrode CE may be formed on the emission layer EL along a stepped region formed by the bank layer BA, the overcoat layer OC, and the passivation layer PAS in the contact portion CA. The common electrode CE may be formed on the auxiliary power electrode AXE corresponding to the undercut region UCA by the undercut structure UC disposed in the contact portion CA. For example, the common electrode CE may include a material which is good in step coverage. The common electrode CE may be better in step coverage than the emission layer EL formed by an evaporation process, and thus, the emission layer EL may be disconnected in the undercut region UCA of the undercut structure UC and may be formed on the auxiliary power electrode AXE exposed at the outside of the undercut region. Therefore, the emission layer EL may not be disposed on the auxiliary power electrode AXE in the undercut region UCA of the undercut structure UC, but the common electrode CE may be disposed on the auxiliary power electrode AXE where the emission layer EL is not disposed and may be electrically connected with the auxiliary power electrode AXE.

Hereinafter, a method of manufacturing a light emitting display device according to an embodiment of the present disclosure will be described in detail with reference to FIGS. 6 to 16.

FIGS. 6 to 16 are manufacturing process diagrams for describing a method of manufacturing a light emitting display device according to an embodiment of the present disclosure.

Figure 6:
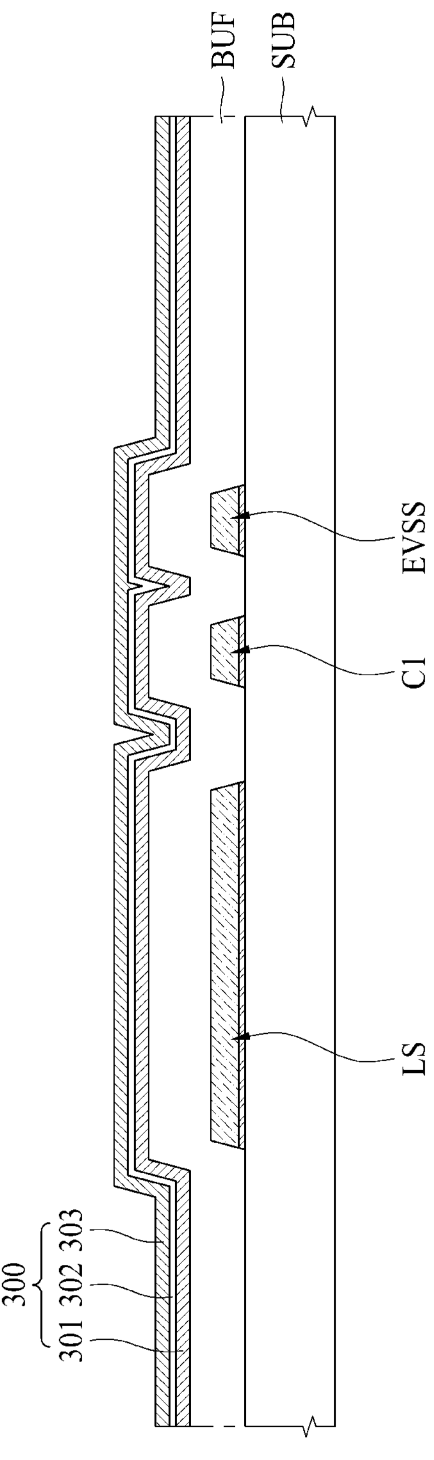
FIGS. 6 to 16 are manufacturing process diagrams for describing a method of manufacturing a light emitting display device according to an embodiment of the present disclosure.

Referring to FIG. 6, a light blocking layer LS may be formed on a substrate SUB by using a first mask. A first capacitor electrode C1 of a storage capacitor Cst and an auxiliary power line EVSS may be formed on the substrate SUB along with the light blocking layer LS. The light blocking layer LS, the first capacitor electrode C1, and the auxiliary power line EVSS may be formed of the same material and may be patterned simultaneously by using the first mask.

Moreover, a buffer layer BUF may be formed on the light blocking layer LS, the first capacitor electrode C1, and the auxiliary power line EVSS. The buffer layer BUF may be formed all over the substrate SUB. For example, the buffer layer BUF may be formed to extend up to a pad area PA from a display area AA of the substrate SUB.

Moreover, one or more material layers 300 configuring an active layer ACT may be formed on the buffer layer BUF. For example, the one or more material layers 300 configuring the active layer ACT may include a first material layer 301, a second material layer 302, and a third material layer 303. For example, the first material layer 301 may include an oxide semiconductor layer including at least one of IGZO, ZTO, and ZIO. The second material layer 302 may include a conductive oxide layer including at least one of ITO and IZO. The third material layer 303 may include a metal layer including at least one of Mo, Ti, and MoTi.

Figure 7:
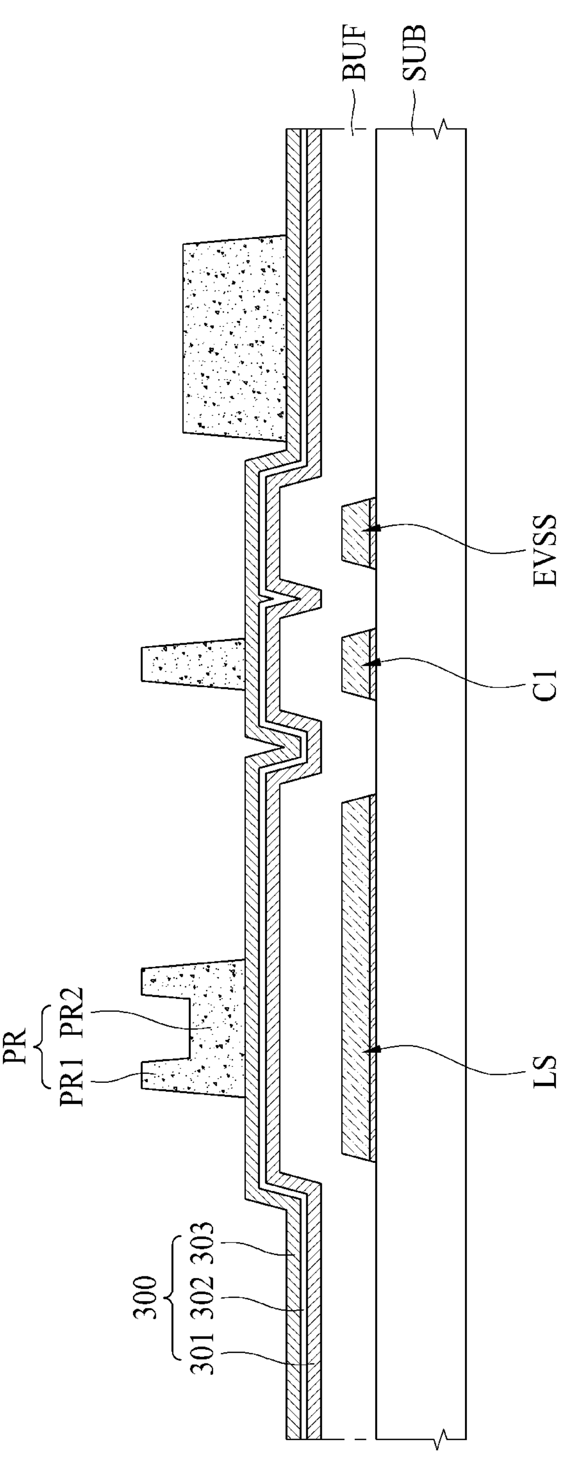

Referring to FIG. 7, a photoresist may be coated on the one or more material layers 300 and may be subjected to an exposure process and a development process by using a halftone mask which is a second mask, and thus, a first photoresist PR1 and a second photoresist PR2 having different heights may be formed. For example, the first photoresist PR1 may be disposed in a region where all of the first material layer 301, the second material layer 302, and the third material layer 303 remain, and the second photoresist PR2 may be disposed in a region where the first material layer 301 remains. The active layer ACT, a second capacitor electrode C2, and an auxiliary power electrode AXE may be patterned by completely etching the one or more material layers 300 of a region which is not masked by the photoresist PR.

Figure 8:
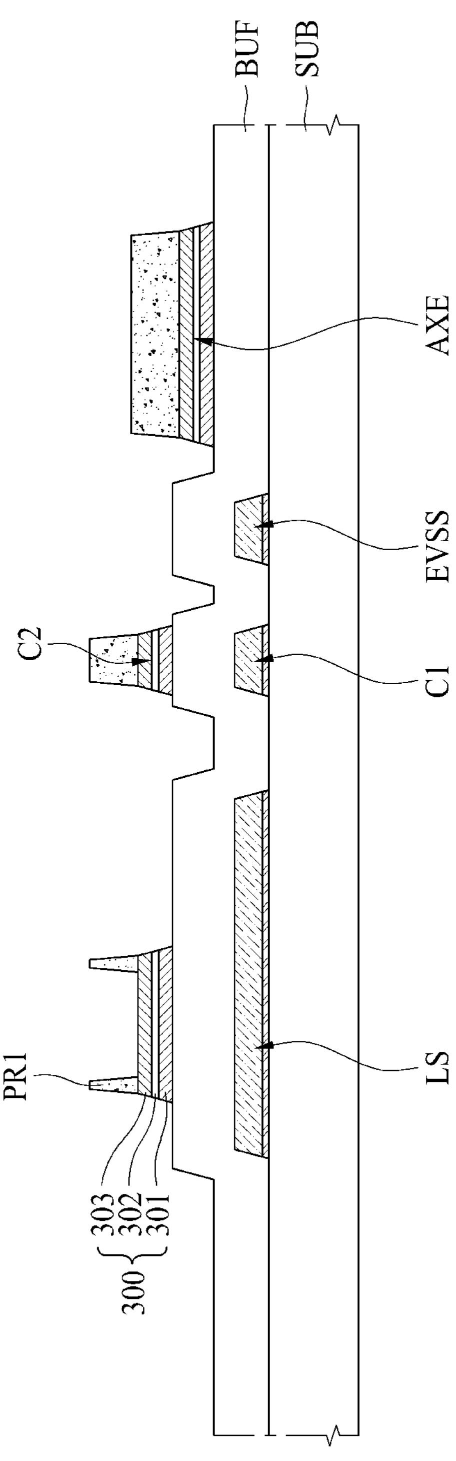

Referring to FIG. 8, by performing a primary etching process by using the photoresist PR as a mask, the second photoresist PR2 may be removed, and the first photoresist PR1 where a height is reduced may remain. Contours of the active layer ACT, the second capacitor electrode C2, and the auxiliary power electrode AXE may be patterned through the primary etching process.

Figure 9:
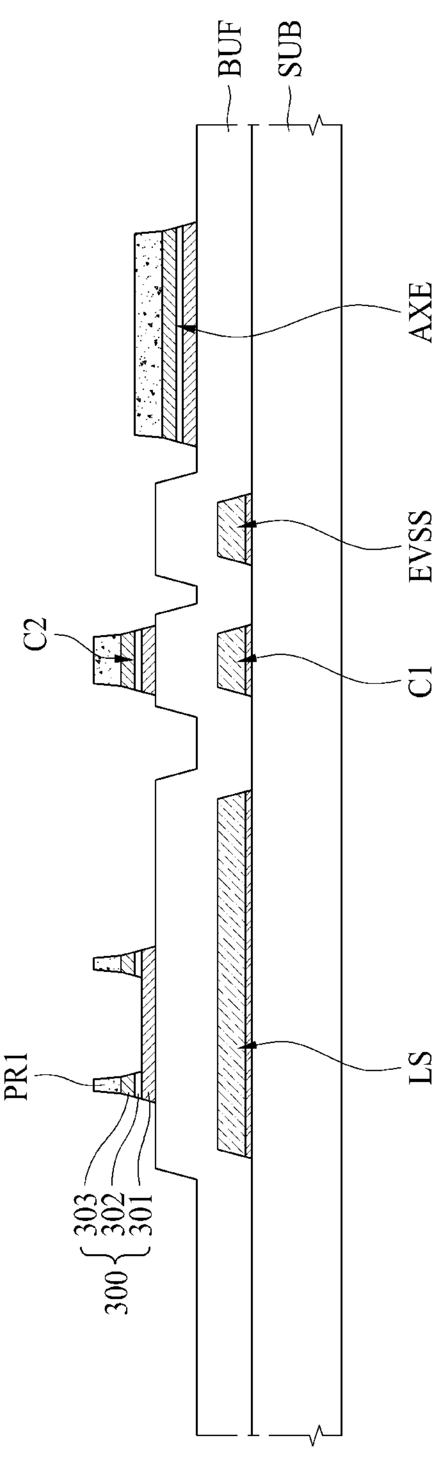

Referring to FIG. 9, by performing a secondary etching process by using the first photoresist PR1 as a mask, a height of the first photoresist PR1 may be more reduced and the second material layer 302 and the third material layer 303, corresponding to a channel region ACT_CH of the active layer ACT which is not masked by the first photoresist PR1, may be removed, and thus, an upper surface of the first material layer 301 may be exposed and the first material layer 301, the second material layer 302, and the third material layer 303 corresponding to a first region ACT_C1 and a second region ACT_C2 of the active layer ACT masked by the first photoresist PR1 may remain. Also, the first material layer 301, the second material layer 302, and the third material layer 303 corresponding to a region of the second capacitor electrode C2 masked by the first photoresist PR1 may remain. Also, the first material layer 301, the second material layer 302, and the third material layer 303 corresponding to a region of the auxiliary power electrode AXE masked by the first photoresist PR1 may remain.

Figure 10:
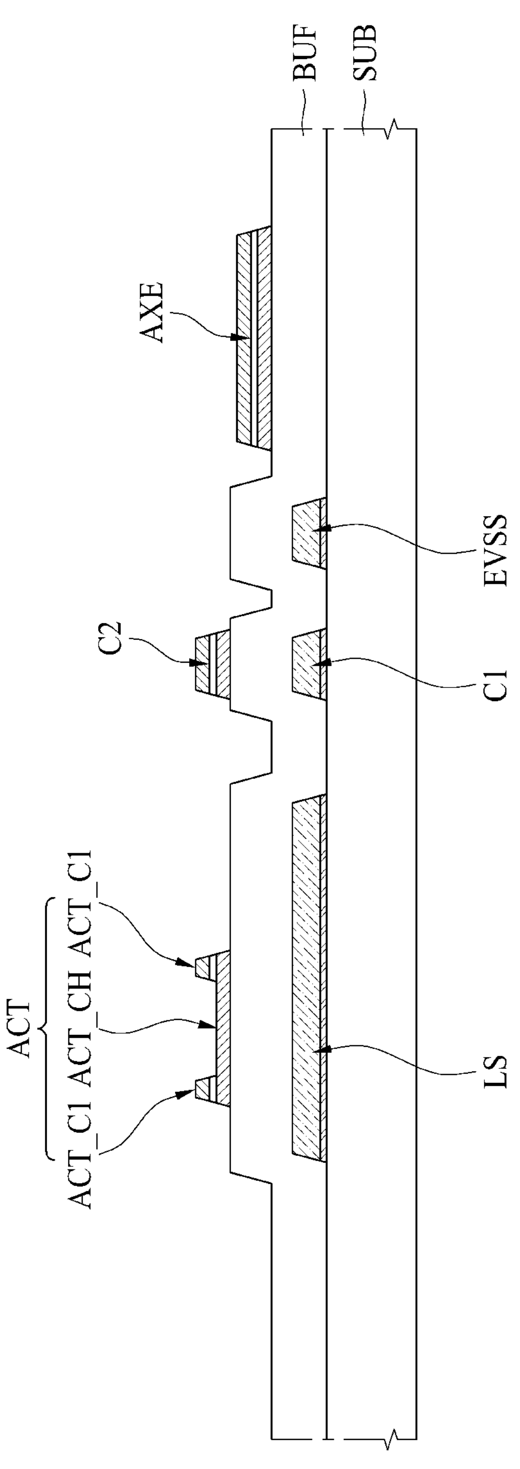

Referring to FIG. 10, the active layer ACT, the second capacitor electrode C2, and the auxiliary power electrode AXE may be patterned by completely removing a remaining photoresist PR.

Figure 11:
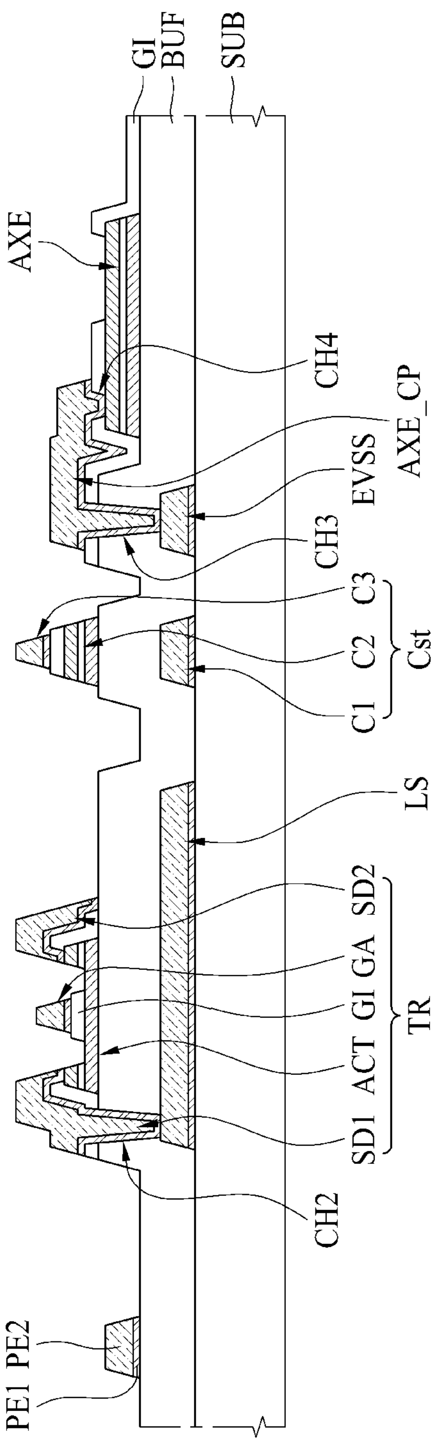

Referring to FIG. 11, a gate insulation layer GI may be formed by using a third mask. Also, a contact hole CH2 and a contact hole CH3 passing through the gate insulation layer GI and the buffer layer BUF and a contact hole CH4 passing through the gate insulation layer GI may be formed together by using the third mask. Also, a gate electrode GA, a first source/drain electrode SD1, a second source/drain electrode SD2, a third capacitor electrode C3, and an auxiliary power connection pattern AXE_CP may be formed together by using a fourth mask. Also, a first pad electrode PE1 and a second pad electrode PE2 of a pad electrode PE may be formed in the pad area PA of the substrate SUB together by using the fourth mask.

Figure 12:
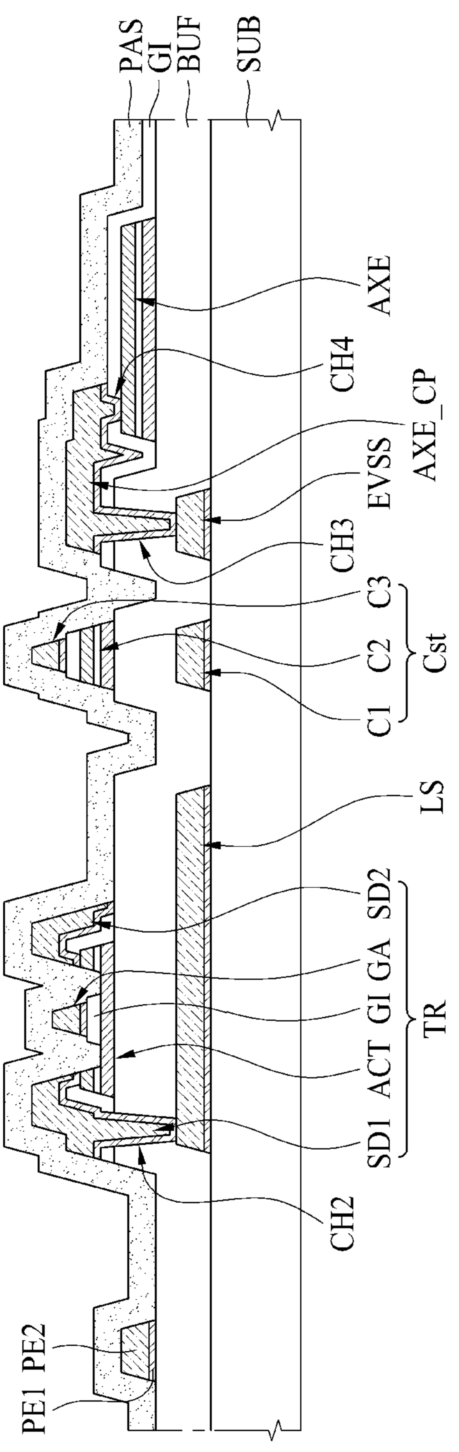

Referring to FIG. 12, a passivation layer PAS may be formed all over the substrate SUB. The passivation layer PAS may be formed in the display area AA and the pad area PA of the substrate SUB. For example, the passivation layer PAS may be formed to extend up to the pad area PA from the display area AA of the substrate SUB.

Figure 13:
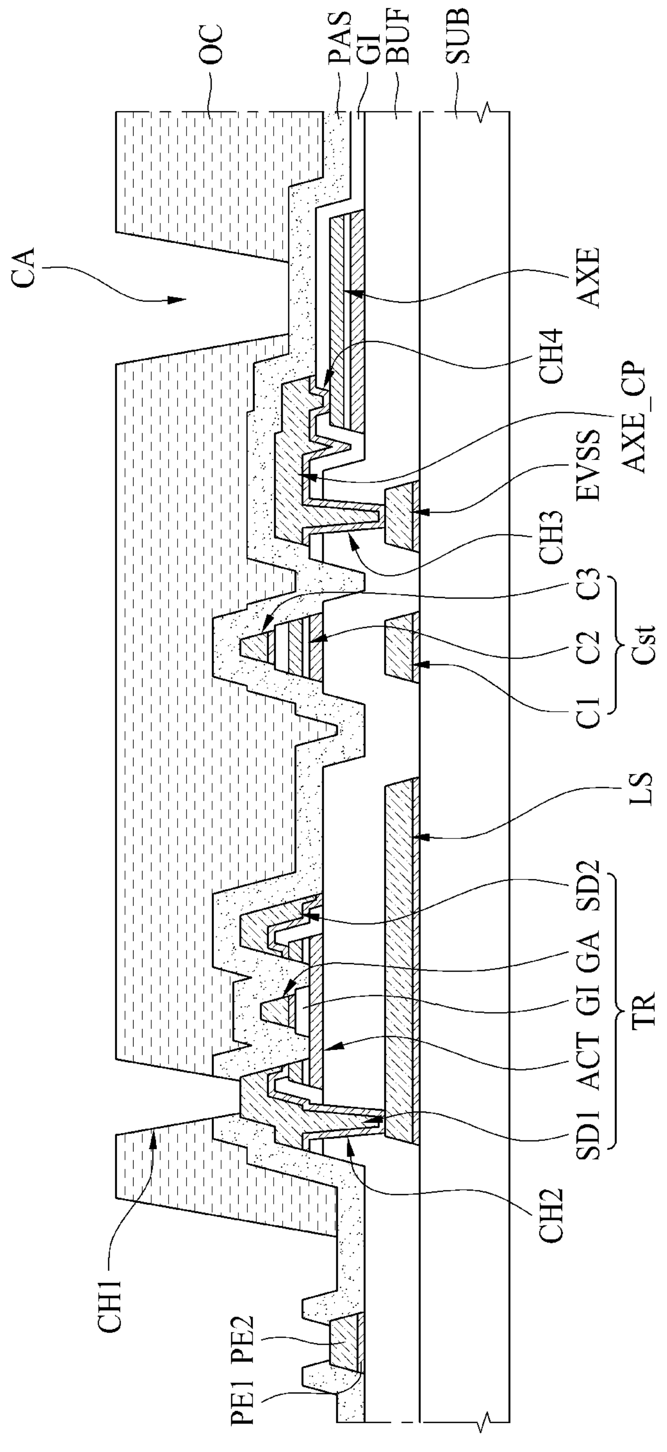

Referring to FIG. 13, an overcoat layer OC may be formed by using a fifth mask. The overcoat layer OC may be formed in the display area AA of the substrate SUB. Also, a portion of a contact hole CH1 passing through the overcoat layer OC may be formed together by using the fifth mask. Also, a second opening portion OC_H of the overcoat layer OC for forming a contact portion CA may be formed together by using the fifth mask. Also, a portion of the passivation layer PAS may be removed by using a sixth mask. The passivation layer PAS exposed through a portion of the contact hole CH1 of the overcoat layer OC may be removed, and thus, the contact hole CH1 passing through the overcoat layer OC and the passivation layer PAS may be completely formed. Also, a contact hole CH5 which passes through the passivation layer PAS to expose a portion of the second pad electrode PE2 may be formed in the pad area PA of the substrate SUB by using the sixth mask.

Figure 14:
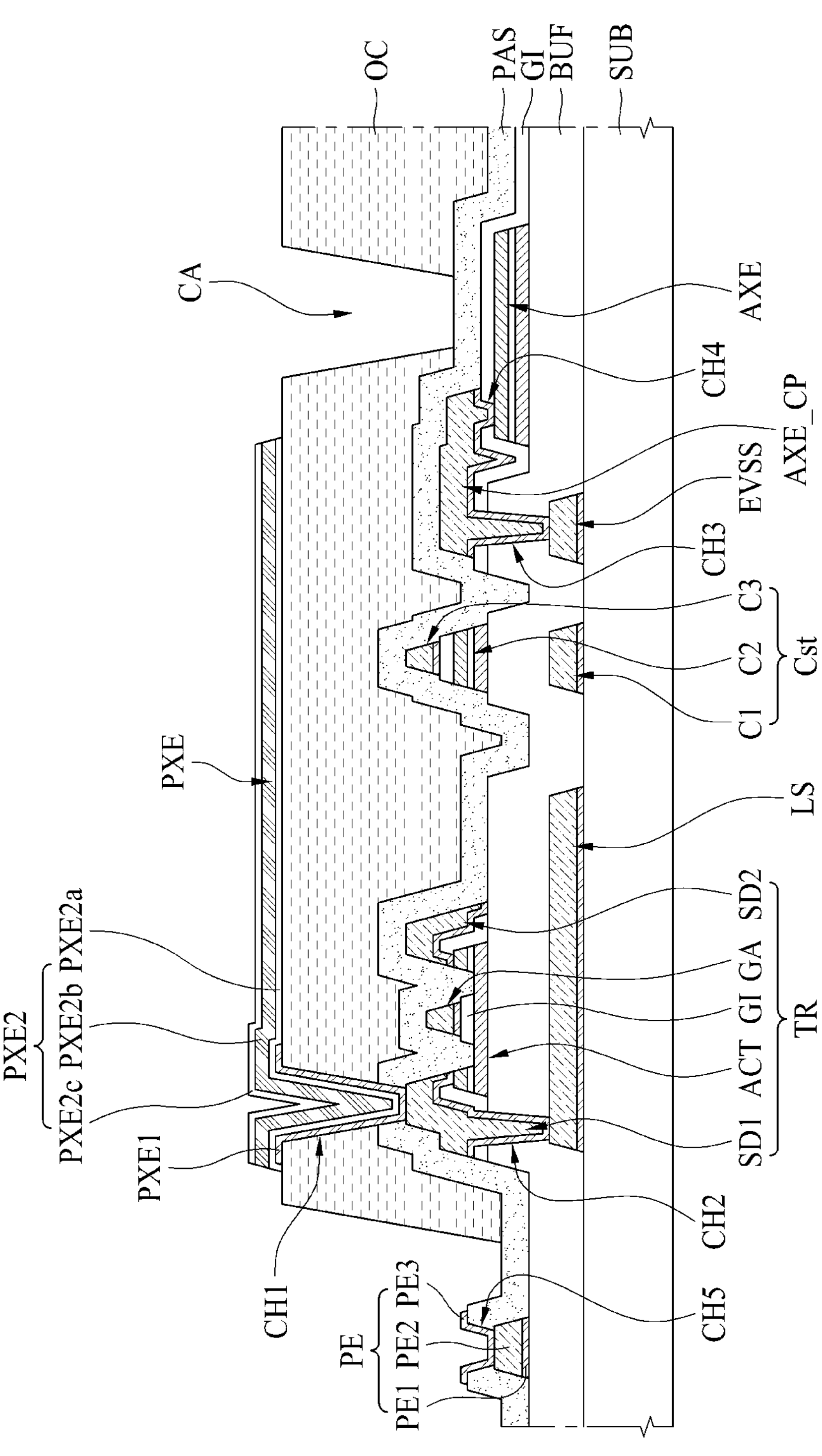

Referring to FIG. 14, a first pixel electrode PXE1 of a pixel electrode PXE may be patterned by using a seventh mask. The first pixel electrode PXE1 may be formed in the contact hole CH1 passing through the overcoat layer OC and the passivation layer PAS. Also, a third pad electrode PE3 connected with a second pad electrode PE2 exposed through the contact hole CH5 may be formed in the pad area PA of the substrate SUB. Also, a second pixel electrode PXE2 of the pixel electrode PXE may be patterned by using an eighth mask. The pixel electrode PXE may be completely formed in the display area AA of the substrate SUB, and the pad electrode PE may be completely formed in the pad area PA.

Figure 15:
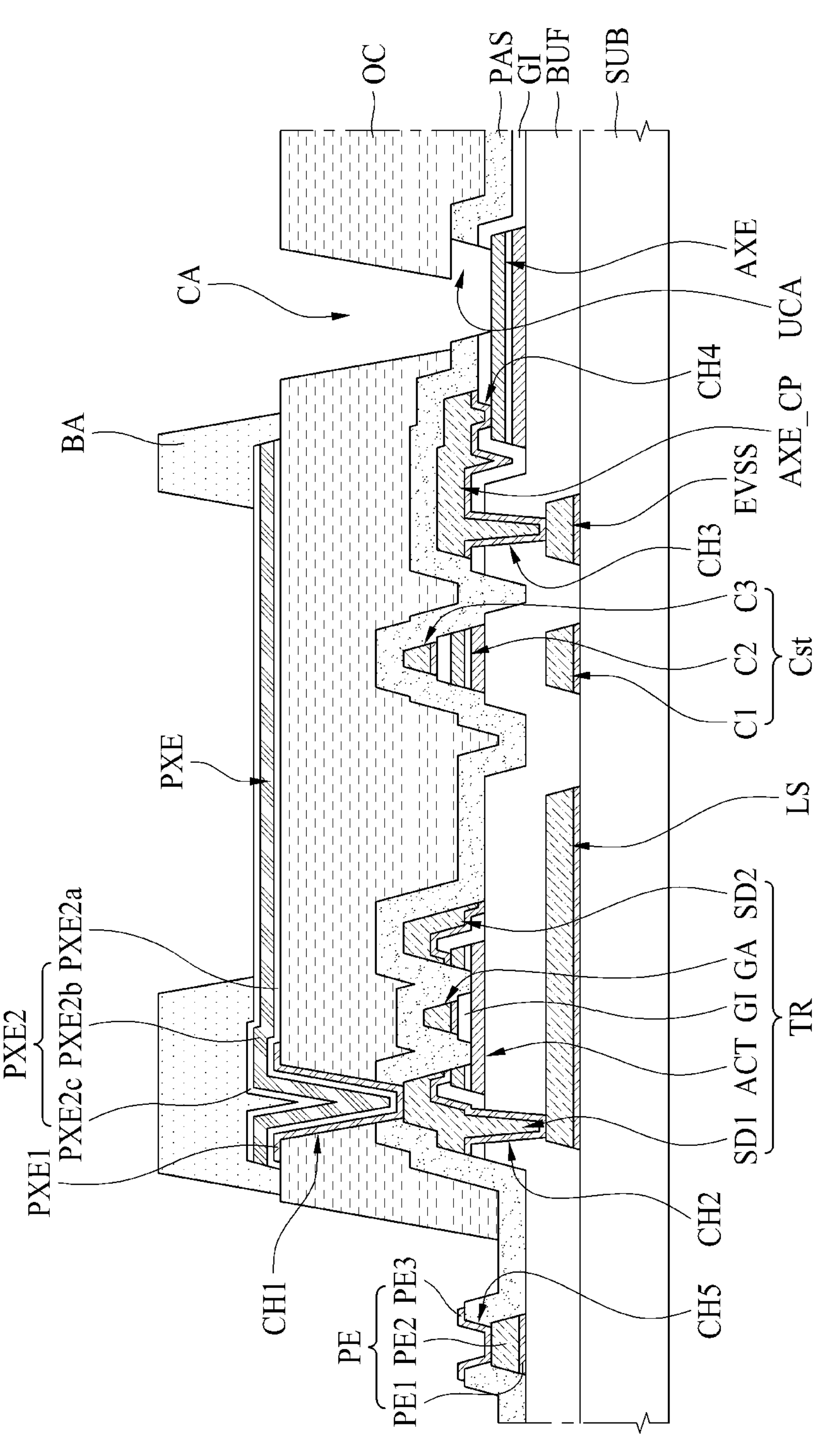

Referring to FIG. 15, a bank layer BA may be formed by using a ninth mask. Also, an undercut region UCA may be formed under the second opening portion OC_H of the overcoat layer OC by using a tenth mask, in the contact portion CA. For example, the tenth mask may cover a portion of an upper surface of the passivation layer PAS and may not be disposed in a portion where the undercut region UCA is to be formed in the contact portion CA, so that the second opening portion OC_H of the overcoat layer OC in the contact portion CA is greater than or equal to a first opening portion PAS_H of the passivation layer PAS. For example, through an etching process using the tenth mask as a mask, a portion of the passivation layer PAS may protrude more than the second opening portion OC_H of the overcoat layer OC, and the first opening portion PAS_H protruding more inward than the second opening portion OC_H of the overcoat layer OC may be formed in the other portion of the passivation layer PAS. Accordingly, a stepped region may be formed at one side by the passivation layer PAS and the overcoat layer OC, and the undercut region UCA may be formed at the other side.

Figure 16:
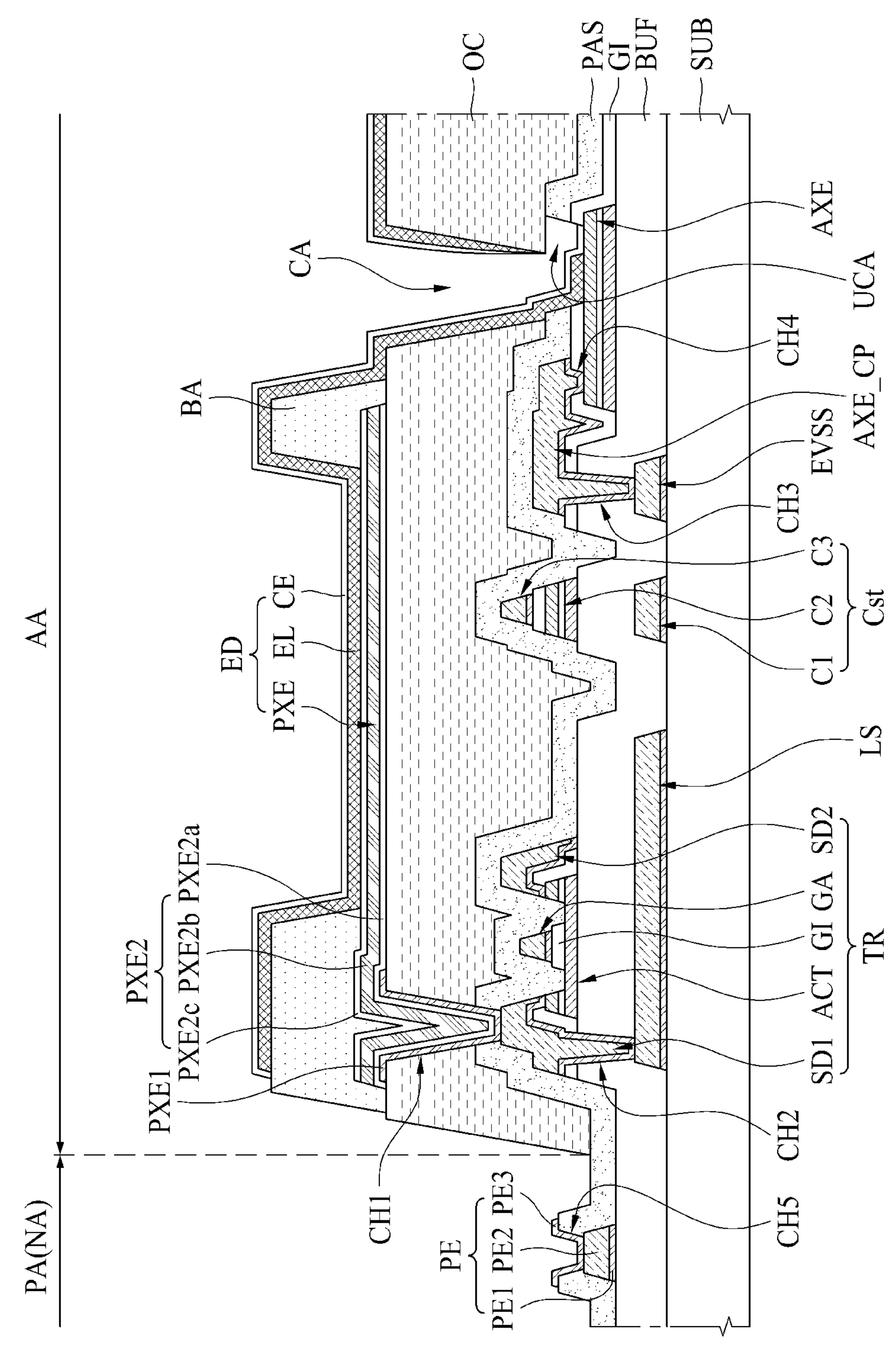

Referring to FIG. 16, the bank layer BA may be formed and the undercut region UCA may be formed by the passivation layer PAS and the overcoat layer OC, and then, an emission layer EL and a common electrode CE may be formed. The emission layer EL may be formed on the pixel electrode PXE and the bank layer BA and may be disconnected without being formed in the undercut region UCA. The common electrode CE may be formed on the emission layer EL. The common electrode CE may be formed on the auxiliary power electrode AXE exposed by the emission layer EL, in the undercut region UCA. The common electrode CE may directly contact and be electrically connected with the auxiliary power electrode AXE.

The light emitting display device according to the embodiment of the present disclosure may be described as follows.

The light emitting display device according to an embodiment of the present disclosure may include a circuit layer including a thin film transistor (TFT) and an auxiliary power electrode disposed on a substrate, at least one protection layer covering the circuit layer, and a contact portion passing through the at least one protection layer to expose a portion of the auxiliary power electrode. The TFT may include an active layer, and the auxiliary power electrode may be disposed on the same layer as the active layer.

In the light emitting display device according to an embodiment of the present disclosure, the auxiliary power electrode may include the same material as a material of the active layer.

In the light emitting display device according to an embodiment of the present disclosure, the active layer may include one or more layers.

In the light emitting display device according to an embodiment of the present disclosure, the active layer may include a first active layer, a second active layer on the first active layer, and a third active layer on the second active layer.

In the light emitting display device according to an embodiment of the present disclosure, the first active layer may include an oxide semiconductor layer including at least one of indium gallium zinc oxide (IGZO), zinc tin oxide (ZTO), and zinc indium oxide (ZIO), the second active layer may include a conductive oxide layer including at least one of indium tin oxide (ITO) and indium zinc oxide (IZO), and the third active layer may include a metal layer including at least one of molybdenum (Mo), titanium (Ti), and a Mo—Ti alloy (MoTi).

In the light emitting display device according to an embodiment of the present disclosure, the TFT may include the active layer, a gate electrode overlapping a channel region of the active layer, a first source/drain electrode connected with a first region of the active layer, and a second source/drain electrode connected with a second region of the active layer, and the gate electrode, the first source/drain electrode, and the second source/drain electrode may include the same material.

In the light emitting display device according to an embodiment of the present disclosure, each of the gate electrode, the first source/drain electrode, and the second source/drain electrode may include one or more layers.

In the light emitting display device according to an embodiment of the present disclosure, each of the gate electrode, the first source/drain electrode, and the second source/drain electrode may include a first metal layer and a second metal layer on the first metal layer, and the second metal layer may include a metal which is lower in resistivity than the first metal layer.

In the light emitting display device according to an embodiment of the present disclosure, the first metal layer may include at least one of molybdenum (Mo), titanium (Ti), and a Mo—Ti alloy (MoTi), and the second metal layer may include copper (Cu).

In the light emitting display device according to an embodiment of the present disclosure, the circuit layer may further include a light blocking layer disposed on the substrate to overlap the active layer of the TFT, an auxiliary power line connected with the auxiliary power electrode, and an auxiliary power connection pattern connected between the auxiliary power electrode and the auxiliary power line.

In the light emitting display device according to an embodiment of the present disclosure, the auxiliary power line may include the same material as a material of the light blocking layer and may be disposed on the same layer as the light blocking layer.

In the light emitting display device according to an embodiment of the present disclosure, the auxiliary power connection pattern may include the same material as a material of each of the gate electrode, the first source/drain electrode, and the second source/drain electrode and may be disposed on the same layer as the gate electrode, the first source/drain electrode, and the second source/drain electrode.

In the light emitting display device according to an embodiment of the present disclosure, the circuit layer may further include a storage capacitor, and the storage capacitor may include a first capacitor electrode formed of the same material as a material of the light blocking layer, on the same layer as the light blocking layer, a second capacitor electrode formed of the same material as a material of the active layer, on the same layer as the active layer, and a third capacitor electrode formed of the same material as a material of each of the gate electrode, the first source/drain electrode, and the second source/drain electrode, on the same layer as the gate electrode, the first source/drain electrode, and the second source/drain electrode.

In the light emitting display device according to an embodiment of the present disclosure, the at least one protection layer may include a first protection layer formed of an inorganic insulating material, on the auxiliary power electrode, and a second protection layer formed of an organic insulating material, on the first protection layer.

In the light emitting display device according to an embodiment of the present disclosure, an undercut region, exposing at least a portion of the auxiliary power electrode in the contact portion, may be provided in the first protection layer and the second protection layer.

In the light emitting display device according to an embodiment of the present disclosure, may further include a pixel electrode disposed on the second protection layer and connected with the TFT, an emission layer on the pixel electrode, and a common electrode on the emission layer, the common electrode may directly contact the auxiliary power electrode, in the undercut region.

In the light emitting display device according to an embodiment of the present disclosure, the first protection layer may include a first opening portion exposing a portion of the auxiliary power electrode, the second protection layer may include a second opening portion including a protrusion portion overlapping at least a portion of the first opening portion, and the undercut region may be provided under the protrusion portion of the second opening portion.

In the light emitting display device according to an embodiment of the present disclosure, may further include an undercut structure formed of the same material as a material of the at least one protection layer, on a portion of the auxiliary power electrode in the contact portion, the undercut structure may include a first pattern formed of the same material as a material of the first protection layer, on a portion of the auxiliary power electrode, and a second pattern formed of the same material as a material of the second protection layer to protrude from the first pattern, on the first pattern, and the undercut region may be provided under the second pattern protruding from a lateral surface of the first pattern.

In the light emitting display device according to an embodiment of the present disclosure, the undercut structure may be formed as an island pattern on a portion of the auxiliary power electrode.

In the light emitting display device according to an embodiment of the present disclosure, the at least one protection layer may further include a contact hole exposing the first source/drain electrode or the second source/drain electrode of the TFT, and the pixel electrode may include a first pixel electrode on the contact hole, and a second pixel electrode on the first pixel electrode.

In the light emitting display device according to an embodiment of the present disclosure, may further include a pad electrode disposed in a pad area of the substrate, at least a portion of the pad electrode may include the same material as a material of the first pixel electrode.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A light emitting display device comprising:

a substrate;

a circuit layer including a thin film transistor (TFT) on the substrate;

an auxiliary power electrode disposed on the substrate;

at least one protection layer covering the circuit layer; and a contact portion passing through the at least one protection layer to expose a portion of the auxiliary power electrode, wherein the TFT comprises an active layer, and the auxiliary power electrode is disposed on a same layer as the active layer, wherein the TFT comprises:

the active layer;

a gate electrode overlapping with a channel region of the active layer;

a first source electrode or a first drain electrode connected with a first region of the active layer; and a second source electrode or a second drain electrode connected with a second region of the active layer, and the gate electrode, the first source electrode or the first drain electrode, and the second source electrode or the second drain electrode comprise a same material, and wherein the at least one protection layer comprises:

a first protection layer formed of an inorganic insulating material, on the auxiliary power electrode; and a second protection layer formed of an organic insulating material, on the first protection layer.

2. The light emitting display device of claim 1, wherein the auxiliary power electrode comprises a same material as a material of the active layer.

3. The light emitting display device of claim 1, wherein the active layer comprises one or more layers.

4. The light emitting display device of claim 3, wherein the active layer comprises:

a first active layer;

a second active layer on the first active layer; and a third active layer on the second active layer.

5. The light emitting display device of claim 4, wherein the first active layer comprises an oxide semiconductor layer, the oxide semiconductor layer including at least one of indium gallium zinc oxide (IGZO), zinc tin oxide (ZTO), or zinc indium oxide (ZIO), the second active layer comprises a conductive oxide layer, the conductive oxide layer including at least one of indium tin oxide (ITO) or indium zinc oxide (IZO), and the third active layer comprises a metal layer, the metal layer including at least one of molybdenum (Mo), titanium (Ti), or a Mo—Ti alloy (MoTi).

6. The light emitting display device of claim 1, wherein each of the gate electrode, the first source electrode or the first drain electrode, and the second source electrode or the second drain electrode comprises one or more layers.

7. The light emitting display device of claim 6, wherein each of the gate electrode, the first source electrode or the first drain electrode, and the second source electrode or the second drain electrode comprises:

a first metal layer; and a second metal layer on the first metal layer, and the second metal layer comprises a metal which is lower in resistivity than the first metal layer.

8. The light emitting display device of claim 7, wherein the first metal layer comprises at least one of molybdenum (Mo), titanium (Ti), or a Mo—Ti alloy (MoTi), and the second metal layer comprises copper (Cu).

9. The light emitting display device of claim 1, wherein the circuit layer further comprises:

a light blocking layer disposed on the substrate to overlap the active layer of the TFT;

an auxiliary power line connected with the auxiliary power electrode; and an auxiliary power connection pattern connected between the auxiliary power electrode and the auxiliary power line.

10. The light emitting display device of claim 9, wherein the auxiliary power line comprises a same material as a material of the light blocking layer and is disposed on a same layer as the light blocking layer.

11. The light emitting display device of claim 9, wherein the auxiliary power connection pattern comprises a same material as a material of each of the gate electrode, the first source electrode or the first drain electrode, and the second source electrode or the second drain electrode and is disposed on a same layer as the gate electrode, the first source electrode or the first drain electrode, and the second source electrode or the second drain electrode.

12. The light emitting display device of claim 9, wherein the circuit layer further comprises a storage capacitor, and the storage capacitor comprises:

a first capacitor electrode formed of a same material as a material of the light blocking layer, on a same layer as the light blocking layer;

a second capacitor electrode formed of a same material as a material of the active layer, on a same layer as the active layer; and a third capacitor electrode formed of a same material as a material of each of the gate electrode, the first source electrode or the first drain electrode, and the second source electrode or the second drain electrode, on the same layer as the gate electrode, the first source electrode or the first drain electrode, and the second source electrode or the second drain electrode.

13. The light emitting display device of claim 1, wherein an undercut region, exposing at least a portion of the auxiliary power electrode in the contact portion, is in the first protection layer and the second protection layer.

14. The light emitting display device of claim 13, further comprising:

a pixel electrode disposed on the second protection layer and connected to the TFT;

an emission layer on the pixel electrode; and a common electrode on the emission layer, wherein the common electrode directly contacts the auxiliary power electrode, in the undercut region.

15. The light emitting display device of claim 14, wherein the at least one protection layer further comprises a contact hole exposing the first source electrode or the first drain electrode, and the second source electrode or the second drain electrode of the TFT, and the pixel electrode comprises:

a first pixel electrode on the contact hole; and a second pixel electrode on the first pixel electrode.

16. The light emitting display device of claim 15, further comprising a pad electrode disposed in a pad area of the substrate, wherein at least a portion of the pad electrode comprises a same material as a material of the first pixel electrode.

17. The light emitting display device of claim 13, wherein the first protection layer comprises a first opening portion exposing a portion of the auxiliary power electrode, the second protection layer comprises a second opening portion, the second opening portion including a protrusion portion overlapping at least a portion of the first opening portion, and the undercut region is under the protrusion portion of the second opening portion.

18. The light emitting display device of claim 13, further comprising an undercut structure formed of the same material as a material of the at least one protection layer, on a portion of the auxiliary power electrode in the contact portion, wherein the undercut structure comprises:

a first pattern formed of the same material as a material of the first protection layer, on a portion of the auxiliary power electrode; and a second pattern formed of the same material as a material of the second protection layer to protrude from the first pattern, on the first pattern, and the undercut region is under the second pattern protruding from a lateral surface of the first pattern.

19. The light emitting display device of claim 18, wherein the undercut structure is formed as an island pattern on a portion of the auxiliary power electrode.

* * * * *